United States Patent
Nguyen et al.

(10) Patent No.: US 8,309,431 B2
(45) Date of Patent: Nov. 13, 2012

(54) METHOD FOR SELF-SUPPORTED TRANSFER OF A FINE LAYER BY PULSATION AFTER IMPLANTATION OR CO-IMPLANTATION

(75) Inventors: Nguyet-Phuong Nguyen, Grenoble (FR); Ian Cayrefourcq, Saint Nazaire les Eymes (FR); Christelle Lagahe-Blanchard, Saint Joseph de Rivière (FR); Konstantin Bourdelle, Crolles (FR); Aurélie Tauzin, Saint Egreve (FR); Franck Fournel, Villard-Bonnot (FR)

(73) Assignee: Commissariat a l'Energie Atomique, Paris (FR)

( * ) Notice: Subject to any disclaimer, the term of this patent is extended or adjusted under 35 U.S.C. 154(b) by 676 days.

(21) Appl. No.: 10/577,175

(22) PCT Filed: Oct. 28, 2004

(86) PCT No.: PCT/FR2004/002779
§ 371 (c)(1),
(2), (4) Date: Apr. 3, 2007

(87) PCT Pub. No.: WO2005/043615
PCT Pub. Date: May 12, 2005

(65) Prior Publication Data
US 2007/0281445 A1    Dec. 6, 2007

(30) Foreign Application Priority Data

Oct. 28, 2003   (FR) .................................. 03 12621

(51) Int. Cl.
*H01L 21/46* (2006.01)
(52) U.S. Cl. ................. 438/458; 257/E21.568
(58) Field of Classification Search ........... 257/E21.568; 438/458
See application file for complete search history.

(56) References Cited

U.S. PATENT DOCUMENTS 3,901,423 A    8/1975   Hillberry et al.
(Continued)

FOREIGN PATENT DOCUMENTS

DE    101 53 319 A1    5/2003
(Continued)

OTHER PUBLICATIONS

Bruel et al., [vol. 99-1] Meeting Abstract No. 333, "Single-crystal semiconductor layer delamination and transfer through hydrogen implantation," *The 195th Metting of The Electrochemical Society*, May 2-6, 1999, Seattle, Washington.

(Continued)

*Primary Examiner* — Matthew Landau
*Assistant Examiner* — Daniel Luke
(74) *Attorney, Agent, or Firm* — Brinks Hofer Gilson & Lione

(57) ABSTRACT

A method for self-supported transfer of a fine layer, in which at least one species of ions is implanted in a source-substrate at a specified depth in relation to the surface of the source-substrate. A stiffener is applied in intimate contact with the source-substrate and the source-substrate undergoes a heat treatment at a specified temperature during a specified period of time in order to create an embrittled buried area substantially at the specified depth without causing a thin layer, defined between the surface and the embrittled buried layer in relation to the remainder of the source-substrate, to become thermally detached. A controlled localized energy pulse is applied to the source-substrate in order to cause the self-supported detachment of the thin layer.

31 Claims, 1 Drawing Sheet

U.S. PATENT DOCUMENTS

| | | | |
|---|---|---|---|
| 3,915,757 A | 10/1975 | Engel | |
| 3,957,107 A | 5/1976 | Altoz et al. | |
| 3,993,909 A | 11/1976 | Drews et al. | |
| 4,006,340 A | 2/1977 | Gorinas | |
| 4,028,149 A | 6/1977 | Deines et al. | |
| 4,039,416 A | 8/1977 | White | |
| 4,074,139 A | 2/1978 | Pankove | |
| 4,107,350 A | 8/1978 | Berg et al. | |
| 4,108,751 A | 8/1978 | King | |
| 4,121,334 A | 10/1978 | Wallis | |
| 4,170,662 A | 10/1979 | Weiss et al. | |
| 4,179,324 A | 12/1979 | Kirkpatrick | |
| 4,244,348 A | 1/1981 | Wilkes | |
| 4,252,837 A | 2/1981 | Auton | |
| 4,254,590 A | 3/1981 | Eisele et al. | |
| 4,274,004 A | 6/1981 | Kanai | |
| 4,342,631 A | 8/1982 | White et al. | |
| 4,346,123 A | 8/1982 | Kaufmann | |
| 4,361,600 A | 11/1982 | Brown | |
| 4,368,083 A | 1/1983 | Bruel et al. | |
| 4,412,868 A | 11/1983 | Brown et al. | |
| 4,452,644 A | 6/1984 | Bruel et al. | |
| 4,468,309 A | 8/1984 | White | |
| 4,471,003 A | 9/1984 | Cann | |
| 4,486,247 A | 12/1984 | Ecer et al. | |
| 4,490,190 A | 12/1984 | Speri | |
| 4,500,563 A | 2/1985 | Ellenberger et al. | |
| 4,508,056 A | 4/1985 | Bruel et al. | |
| 4,536,657 A | 8/1985 | Bruel | |
| 4,539,050 A | 9/1985 | Kramler et al. | |
| 4,542,863 A | 9/1985 | Larson | |
| 4,566,403 A | 1/1986 | Fournier | |
| 4,567,505 A | 1/1986 | Pease | |
| 4,568,563 A | 2/1986 | Jackson et al. | |
| 4,585,945 A | 4/1986 | Bruel et al. | |
| 4,630,093 A | 12/1986 | Yamaguchi et al. | |
| 4,684,535 A | 8/1987 | Heinecke et al. | |
| 4,704,302 A | 11/1987 | Bruel et al. | |
| 4,717,683 A | 1/1988 | Parrillo et al. | |
| 4,764,394 A | 8/1988 | Conrad | |
| 4,837,172 A | 6/1989 | Mizuno et al. | |
| 4,846,928 A | 7/1989 | Dolins et al. | |
| 4,847,792 A | 7/1989 | Barna et al. | |
| 4,853,250 A | 8/1989 | Boulos et al. | |
| 4,887,005 A | 12/1989 | Rough et al. | |
| 4,891,329 A | 1/1990 | Reisman et al. | |
| 4,894,709 A | 1/1990 | Phillips et al. | |
| 4,904,610 A | 2/1990 | Shyr | |
| 4,920,396 A | 4/1990 | Shinohara et al. | |
| 4,929,566 A | 5/1990 | Beitman | |
| 4,931,405 A | 6/1990 | Kamijo et al. | |
| 4,948,458 A | 8/1990 | Ogle | |
| 4,952,273 A | 8/1990 | Popov | |
| 4,956,698 A | 9/1990 | Wang | |
| 4,960,073 A | 10/1990 | Suzuki et al. | |
| 4,975,126 A | 12/1990 | Margail et al. | |
| 4,982,090 A | 1/1991 | Wittmaack | |
| 4,996,077 A | 2/1991 | Moslehi et al. | |
| 5,013,681 A | 5/1991 | Godbey et al. | |
| 5,015,353 A | 5/1991 | Hubler et al. | |
| 5,034,343 A | 7/1991 | Rouse et al. | |
| 5,036,023 A | 7/1991 | Dautremont-Smith et al. | |
| 5,110,748 A | 5/1992 | Sarma | |
| 5,120,666 A | 6/1992 | Gotou | |
| 5,138,422 A | 8/1992 | Fujii et al. | |
| 5,198,371 A | 3/1993 | Li | |
| 5,200,805 A | 4/1993 | Parsons et al. | |
| 5,232,870 A | 8/1993 | Ito et al. | |
| 5,234,535 A | 8/1993 | Beyer et al. | |
| 5,242,863 A | 9/1993 | Xiang-Zheng et al. | |
| 5,250,446 A | 10/1993 | Osawa et al. | |
| 5,256,581 A | 10/1993 | Foerstner et al. | |
| 5,259,247 A | 11/1993 | Bantien | |
| 5,300,788 A | 4/1994 | Fan et al. | |
| 5,310,446 A | 5/1994 | Konishi et al. | |
| 5,374,564 A | 12/1994 | Bruel | |
| 5,400,458 A | 3/1995 | Rambosek | |
| 5,405,802 A | 4/1995 | Yamagata et al. | |
| 5,413,951 A | 5/1995 | Ohori et al. | |
| 5,442,205 A | 8/1995 | Brasen et al. | |
| 5,494,835 A | 2/1996 | Bruel | |
| 5,524,339 A | 6/1996 | Gorowitz et al. | |
| 5,539,241 A | 7/1996 | Abidi et al. | |
| 5,559,043 A | 9/1996 | Bruel | |
| 5,567,654 A | 10/1996 | Beilstein, Jr. et al. | |
| 5,611,316 A | 3/1997 | Oshima et al. | |
| 5,618,739 A | 4/1997 | Takahashi et al. | |
| 5,622,896 A | 4/1997 | Knotter et al. | |
| 5,633,174 A | 5/1997 | Li | |
| 5,661,333 A | 8/1997 | Bruel et al. | |
| 5,714,395 A | 2/1998 | Bruel | |
| 5,741,733 A | 4/1998 | Bertagnolli et al. | |
| 5,753,038 A | 5/1998 | Vichr et al. | |
| 5,804,086 A | 9/1998 | Bruel | |
| 5,811,348 A | 9/1998 | Matsushita et al. | |
| 5,817,368 A | 10/1998 | Hashimoto | |
| 5,854,123 A | 12/1998 | Sato et al. | |
| 5,863,830 A | 1/1999 | Bruel et al. | |
| 5,863,832 A | 1/1999 | Doyle et al. | |
| 5,877,070 A | 3/1999 | Goesele et al. | |
| 5,880,010 A | 3/1999 | Davidson | |
| 5,882,987 A | 3/1999 | Srikrishnan | |
| 5,897,331 A | 4/1999 | Sopori | |
| 5,909,627 A | 6/1999 | Egloff | |
| 5,920,764 A | 7/1999 | Hanson et al. | |
| 5,953,622 A | 9/1999 | Lee et al. | |
| 5,966,620 A | 10/1999 | Sakaguchi et al. | |
| 5,981,400 A | 11/1999 | Lo | |
| 5,985,412 A | 11/1999 | Gösele | |
| 5,993,677 A | 11/1999 | Biasse et al. | |
| 5,994,207 A | 11/1999 | Henley et al. | |
| 6,010,591 A | 1/2000 | Gösele | |
| 6,013,563 A | 1/2000 | Henley et al. | |
| 6,013,954 A | 1/2000 | Hamajima | |
| 6,020,252 A | 2/2000 | Aspar et al. | |
| 6,033,974 A | 3/2000 | Henley et al. | |
| 6,048,411 A | 4/2000 | Henley et al. | |
| 6,054,363 A | 4/2000 | Sakaguchi et al. | |
| 6,054,370 A | 4/2000 | Doyle | |
| 6,057,212 A | 5/2000 | Chan et al. | |
| 6,071,795 A | 6/2000 | Cheung et al. | |
| 6,080,640 A | 6/2000 | Gardner et al. | |
| 6,096,433 A | 8/2000 | Kikuchi et al. | |
| 6,103,597 A | 8/2000 | Aspar et al. | |
| 6,103,599 A | 8/2000 | Henley et al. | |
| 6,118,181 A | 9/2000 | Merchant et al. | |
| 6,127,199 A | 10/2000 | Inoue | |
| 6,146,979 A | 11/2000 | Henley et al. | |
| 6,150,239 A | 11/2000 | Goesele et al. | |
| 6,156,215 A | 12/2000 | Shimada et al. | |
| 6,159,323 A | 12/2000 | Joly et al. | |
| 6,190,998 B1 | 2/2001 | Bruel et al. | |
| 6,197,695 B1 | 3/2001 | Joly et al. | |
| 6,198,159 B1 | 3/2001 | Hosoma et al. | |
| 6,200,878 B1 | 3/2001 | Yamagata et al. | |
| 6,204,079 B1 | 3/2001 | Aspar et al. | |
| 6,225,190 B1 | 5/2001 | Bruel et al. | |
| 6,225,192 B1 | 5/2001 | Aspar et al. | |
| 6,251,754 B1 | 6/2001 | Ohshima et al. | |
| 6,271,101 B1 | 8/2001 | Fukunaga | |
| 6,276,345 B1 | 8/2001 | Nelson et al. | |
| 6,287,940 B1 | 9/2001 | Cole et al. | |
| 6,294,478 B1 | 9/2001 | Sakaguchi et al. | |
| 6,303,468 B1 | 10/2001 | Aspar et al. | |
| 6,306,720 B1 | 10/2001 | Ding | |
| 6,310,387 B1 | 10/2001 | Seefeldt et al. | |
| 6,316,333 B1 | 11/2001 | Bruel et al. | |
| 6,323,108 B1 | 11/2001 | Kub et al. | |
| 6,323,109 B1 | 11/2001 | Okonogi | |
| 6,346,458 B1 | 2/2002 | Bower | |
| 6,362,077 B1 | 3/2002 | Aspar et al. | |
| 6,362,082 B1 | 3/2002 | Doyle et al. | |
| 6,407,929 B1 | 6/2002 | Hale et al. | |
| 6,417,075 B1 | 7/2002 | Haberger et al. | |
| 6,429,094 B1 | 8/2002 | Maleville et al. | |
| 6,429,104 B1 | 8/2002 | Auberton-Herve | |
| 6,465,892 B1 | 10/2002 | Suga | |

| | | | | | | |
|---|---|---|---|---|---|---|
| 6,504,235 B2 | 1/2003 | Schmitz et al. | | 2009/0130392 A1 | 5/2009 | Aspar et al. |
| 6,511,899 B1 * | 1/2003 | Henley et al. ............. 438/515 | | 2009/0156016 A1 | 6/2009 | Di Cioccio |
| 6,513,564 B2 | 2/2003 | Bryan et al. | | 2010/0025228 A1 | 2/2010 | Tauzin et al. |
| 6,529,646 B1 | 3/2003 | Wight et al. | | 2010/0167499 A1 | 7/2010 | Fournel et al. |
| 6,534,380 B1 | 3/2003 | Yamauchi et al. | | 2010/0216294 A1 | 8/2010 | Rabarot et al. |
| 6,548,375 B1 | 4/2003 | De Los Santos et al. | | 2010/0323497 A1 | 12/2010 | Fournel |
| 6,593,212 B1 | 7/2003 | Kub et al. | | | | |
| 6,596,569 B1 | 7/2003 | Bao et al. | | FOREIGN PATENT DOCUMENTS | | |
| 6,607,969 B1 | 8/2003 | Kub et al. | | | | |
| 6,632,082 B1 | 10/2003 | Smith | | EP | 02 293 049 A1 | 5/1988 |
| 6,645,831 B1 | 11/2003 | Shaheen et al. | | EP | 02 293 049 B1 | 5/1988 |
| 6,645,833 B2 | 11/2003 | Brendel | | EP | 0 355 913 A1 | 2/1990 |
| 6,653,207 B2 | 11/2003 | Ohya et al. | | EP | 0 383 391 A1 | 8/1990 |
| 6,727,549 B1 | 4/2004 | Doyle | | EP | 0 410 679 A1 | 1/1991 |
| 6,756,285 B1 | 6/2004 | Moriceau et al. | | EP | 0 504 714 A2 | 9/1992 |
| 6,756,286 B1 | 6/2004 | Moriceau et al. | | EP | 0 660 140 A1 | 6/1995 |
| 6,762,076 B2 | 7/2004 | Kim et al. | | EP | 0 665 588 A1 | 8/1995 |
| 6,764,936 B2 | 7/2004 | Daneman et al. | | EP | 0 703 609 A1 | 3/1996 |
| 6,770,507 B2 | 8/2004 | Abe et al. | | EP | 0 754 953 B1 | 1/1997 |
| 6,774,010 B2 | 8/2004 | Chu et al. | | EP | 0 793 263 A2 | 9/1997 |
| 6,809,009 B2 | 10/2004 | Aspar et al. | | EP | 0 801 419 A1 | 10/1997 |
| 6,828,214 B2 | 12/2004 | Notsu et al. | | EP | 0 807 970 A1 | 11/1997 |
| 6,846,690 B2 | 1/2005 | Farcy et al. | | EP | 0 849 788 A2 | 6/1998 |
| 6,887,769 B2 | 5/2005 | Kellar et al. | | EP | 0 889 509 A2 | 1/1999 |
| 6,893,936 B1 | 5/2005 | Chen et al. | | EP | 0 895 282 A2 | 2/1999 |
| 6,902,987 B1 | 6/2005 | Tong et al. | | EP | 0 898 307 A1 | 2/1999 |
| 6,927,147 B2 | 8/2005 | Fitzgerald et al. | | EP | 0 917 193 A1 | 5/1999 |
| 6,946,365 B2 | 9/2005 | Aspar et al. | | EP | 0 938 129 A1 | 8/1999 |
| 6,947,365 B2 | 9/2005 | Lai et al. | | EP | 0 533 551 B1 | 3/2000 |
| 6,974,759 B2 | 12/2005 | Moriceau et al. | | EP | 0 902 843 B1 | 3/2000 |
| 6,991,956 B2 | 1/2006 | Ghyselen et al. | | EP | 0 989 593 A2 | 3/2000 |
| 7,018,909 B2 | 3/2006 | Ghyselen et al. | | EP | 0 994 503 A1 | 4/2000 |
| 7,029,548 B2 | 4/2006 | Aspar et al. | | EP | 1 050 901 A2 | 11/2000 |
| 7,029,980 B2 | 4/2006 | Liu et al. | | EP | 1 059 663 A2 | 12/2000 |
| 7,052,978 B2 * | 5/2006 | Shaheen et al. ............. 438/463 | | EP | 1 096 259 A1 | 5/2001 |
| 7,067,396 B2 | 6/2006 | Aspar et al. | | EP | 0 717 437 B1 | 4/2002 |
| 7,078,811 B2 | 7/2006 | Suga | | EP | 0 786 801 A1 | 6/2003 |
| RE39,484 E | 2/2007 | Bruel | | EP | 0 767 486 B1 | 1/2004 |
| 7,256,075 B2 | 8/2007 | Ghyselen et al. | | EP | 0 925 888 B1 | 11/2004 |
| 7,348,260 B2 | 3/2008 | Ghyselen | | EP | 1 014 452 B1 | 5/2006 |
| 7,416,957 B2 | 8/2008 | Ponomarev | | FR | 2 558 263 A1 | 7/1985 |
| 7,459,374 B2 | 12/2008 | Aulnette et al. | | FR | 2 671 472 A1 | 7/1992 |
| 7,465,646 B2 | 12/2008 | Le Vaillant | | FR | 2 681 472 A1 | 3/1993 |
| 7,476,596 B1 | 1/2009 | Lieber et al. | | FR | 2 725 074 A1 | 3/1996 |
| 7,494,897 B2 | 2/2009 | Fournel et al. | | FR | 95 08882 | 6/1996 |
| 7,498,234 B2 | 3/2009 | Aspar et al. | | FR | 2 736 934 A1 | 1/1997 |
| 7,521,292 B2 | 4/2009 | Rogers et al. | | FR | 2 748 850 A1 | 11/1997 |
| 7,534,701 B2 | 5/2009 | Ghyselen et al. | | FR | 2 748 851 | 11/1997 |
| 7,615,463 B2 | 11/2009 | Aspar et al. | | FR | 2 758 907 A1 | 7/1998 |
| 7,670,930 B2 | 3/2010 | Tauzin et al. | | FR | 2 767 416 A1 | 2/1999 |
| 7,713,369 B2 | 5/2010 | Aspar et al. | | FR | 2 767 604 A1 | 2/1999 |
| 7,772,087 B2 | 8/2010 | Nguyen et al. | | FR | 2 771 852 A1 | 6/1999 |
| 7,883,994 B2 | 2/2011 | Moriceau et al. | | FR | 2 773 261 | 7/1999 |
| 7,902,038 B2 | 3/2011 | Aspar et al. | | FR | 2 774 510 A1 | 8/1999 |
| 2001/0007367 A1 | 7/2001 | Ohkubo | | FR | 2 781 925 A1 | 2/2000 |
| 2001/0007789 A1 | 7/2001 | Aspar et al. | | FR | 2 789 518 A1 | 8/2000 |
| 2002/0000646 A1 | 1/2002 | Gooch et al. | | FR | 2 796 491 | 1/2001 |
| 2002/0025604 A1 | 2/2002 | Tiwari | | FR | 2 797 347 | 2/2001 |
| 2002/0081861 A1 | 6/2002 | Robinson et al. | | FR | 2 809 867 | 12/2001 |
| 2002/0083387 A1 | 6/2002 | Miner et al. | | FR | 2 819 099 A1 | 7/2002 |
| 2002/0145489 A1 | 10/2002 | Cornett et al. | | FR | 2 847 075 A1 | 5/2004 |
| 2002/0153563 A1 | 10/2002 | Ogura | | GB | 2 211 991 A | 7/1989 |
| 2002/0185469 A1 | 12/2002 | Podlesnik et al. | | JP | 53-104156 A | 9/1978 |
| 2002/0185684 A1 | 12/2002 | Campbell et al. | | JP | 58-031519 A | 2/1983 |
| 2003/0001221 A1 | 1/2003 | Fischer et al. | | JP | 59-054217 A | 3/1984 |
| 2003/0077885 A1 | 4/2003 | Aspar et al. | | JP | 61-129872 A | 6/1986 |
| 2003/0119279 A1 | 6/2003 | Enquist | | JP | 62265717 | 11/1987 |
| 2003/0119280 A1 | 6/2003 | Lee et al. | | JP | 101004013 | 1/1989 |
| 2003/0134489 A1 | 7/2003 | Schwarzenbach et al. | | JP | 01-128570 A | 5/1989 |
| 2003/0162367 A1 | 8/2003 | Roche | | JP | 01-169917 A | 7/1989 |
| 2003/0199105 A1 | 10/2003 | Kub et al. | | JP | 08-017777 A | 1/1990 |
| 2004/0144487 A1 | 7/2004 | Martinez et al. | | JP | 04-199504 A | 7/1992 |
| 2004/0171232 A1 * | 9/2004 | Cayrefourcq et al. ........ 438/458 | | JP | 07-254690 | 10/1995 |
| 2005/0148163 A1 | 7/2005 | Nguyen et al. | | JP | 7-302889 | 11/1995 |
| 2006/0252229 A1 | 11/2006 | Joly et al. | | JP | 08-133878 A | 5/1996 |
| 2006/0281212 A1 | 12/2006 | Moriceau et al. | | JP | 09-213594 | 8/1997 |
| 2007/0037363 A1 | 2/2007 | Aspar et al. | | JP | 09-307719 | 11/1997 |
| 2008/0254591 A1 | 10/2008 | Deguet et al. | | JP | 10-163166 A | 6/1998 |
| 2009/0120568 A1 | 5/2009 | Deguet et al. | | JP | 10-233352 A | 9/1998 |
| | | | | JP | 11045862 | 2/1999 |

| | | |
|---|---|---|
| JP | 11-87668 | 3/1999 |
| JP | 11074208 | 3/1999 |
| JP | 11-145436 | 5/1999 |
| JP | 11-233449 | 8/1999 |
| JP | 11-317577 A | 11/1999 |
| RU | 128757 A1 | 6/2000 |
| WO | WO 95/20824 A1 | 8/1995 |
| WO | WO 99/08316 | 2/1999 |
| WO | WO 99/35674 A1 | 7/1999 |
| WO | WO 99/39378 | 8/1999 |
| WO | WO 00/48238 | 8/2000 |
| WO | WO 00/63965 | 10/2000 |
| WO | WO 01/11930 A2 | 2/2001 |
| WO | WO 01/43168 A2 | 6/2001 |
| WO | WO 02/05344 A1 | 1/2002 |
| WO | WO 02/47156 A1 | 6/2002 |
| WO | WO 02/083387 A1 | 10/2002 |
| WO | WO 03/013815 A1 | 2/2003 |
| WO | WO 03/021667 A2 | 3/2003 |
| WO | WO 03/063213 A2 | 7/2003 |
| WO | WO 2004/044976 A1 | 5/2004 |

OTHER PUBLICATIONS

Camperi-Ginestet et al., "Alignable Epitaxial Liftoff of GaAs Materials with Selective Deposition Using Polyimide Diaphragms", *IEEE Transactions Photonics Technology Letters*, vol. 3, No. 12, Dec. 1991, pp. 1123-1126.
Demeester, et al., "Epitaxial Lift-off and its Applications", *Semicond. Sci. Technol.*, vol. 8, 1993, pp. 1124-1135.
DiCioccio et al., "III-V layer transfer onto silicon and applications", *Phys. Stat. Sol. (a)*, vol. 202, No. 4., 2005, pp. 509-515/DOI 10.1002/pssa. 200460411.
Feijoo et al., "Prestressing of Bonded Wafers", vol. 92-7 1992 pp. 230-238.
Feng et al., "Generalized Formula for Curvature Radius and Layer Stresses Caused by Thermal Strain in Semiconductor Multilayer Structures", *J. Appl. Phys.*, vol. 54, No. 1, 1983, pp. 83-85.
Hamaguchi, et al., "Novel LSI/SOI Wafer Fabrication Using Device Layer Transfer Technique" *Proc. IEDM*, 1985, pp. 688-691.
Kucheyev et al., "Ion implantation into GaN", *Materials Science and Engineering*, 33, 2001, pp. 51-107.
Liu et al., "Ion implantation in GaN at liquid-nitrogen temperature: Structural characteristics and amorphization," *Physical Review B of The American Physical Society*, vol. 57, No. 4, 1988, pp. 2530-2535.
Moriceau et al., [vol. 99-1] Meeting Abstract No. 405, "A New Characterization Process Used to Qualify SOI Films," *The 195th Meeting of The Electrochemical Society*, May 2-6, 1999, Seattle, Washington.
Pollentier et al., "Fabrication of High-Radiance LEDs by Epitaxial Lift-off" *SPIE*, vol. 1361, 1990, pp. 1056-1062.
Suzuki et al., "High-Speed and Low Power $n^+$-$p^+$ Double-Gate SOI CMOS", *IEICE Trans. Electron.*, vol. E78-C, No. 4, Apr. 1995, pp. 360-367.
Timoshenko, S., "Analysis of Bi-Metal Thermostats", *J. Opt. Soc. Am.*, 11, 1925, pp. 233-256.
Tong et al, "Low Temperature SI Layer Splitting", *Proceedings 1997 IEEE International SOI Conference*, Oct. 1997, pp. 126-127.
Wong et al., "Integration of GaN Thin Films with Dissimilar Substrate Materials by Pd-In Metal Bonding and Laser Lift-off", *Journal of Electronic Materials*, vol. 28, No. 12, 1999, pp. 1409-1413.
Yun et al., "Fractional Implantation Area Effects on Patterned Ion-Cut Silicon Layer Transfer," Dept. of Electrical Eng. And Computer Sciences, University of California, Berkeley, CA 94720, USA, 1999 IEEE International SOI Conference, Oct. 1999, p. 129-130.
Yun et al., "Thermal and Mechanical Separations of Silicon Layers from Hydrogen Pattern-Implanted Wafers," Journal of Electronic Materials, vol. No. 36, No. 8 2001.
Argawal et al., "Efficient Production of Silicon-on-Insulator Films by Co-Implantation of He+ with H+," *Applied Physics Letters*, vol. 72, No. 9, Mar. 2, 1998 ; pp. 1086-1088.
Cerofolini et al., *Materials Science and Engineering*, B71-2000, pp. 196-202.
Henttinen et al., *Applied Physics Letters*, vol. 16, No. 17, Apr. 24, 2000; pp. 2370-2372.

Office Action (Non-Final) for U.S. Appl. No. 10/975,826—Dated May 5, 2006.
Office Action (Non-Final) for U.S. Appl. No. 10/975,826 Dated Nov. 28, 2006.
Office Action (Non-Final) for U.S. Appl. No. 10/975,826—Dated Jul. 17, 2007.
Office Action (Non-Final) for U.S. Appl. No. 10/975,826—Dated Apr. 1, 2008.
Office Action (Final) for U.S. Appl. No. 10/975,826—Dated Dec. 10, 2008.
U.S. District Court District of Delaware (Wilmington) Civil Docket for Case #: 1:08-cv-00292-SLR—(11 pgs).
Complaint filed with Jury Demand against MEMC Electronic Materials Inc.—Magistrate Consent Notice to Pltf. ( Filing fee $ 350, receipt No. 152004.)—filed by SOITEC Silicon On Insulator Technologies SA, Commissariat a LEnergie Atomique. (Attachments: # 1 Exhibit 1, # 2 Exhibit 2, # 3 Exhibit 3, # 4 Civil Cover Sheet, # 5 Acknowledgement of Consent Form) (sns, ) (Entered: May 20, 2008) (47 pgs).
Notice of Availability of a U.S. Magistrate Judge to Exercise Jurisdiction (sns, ) (Entered: May 20, 2008) (1 pg).
Report to the Commissioner of Patents and Trademarks for Patent/Trademark Nos. RE39,484 E; 6,809,009; 7,067,396 B2; (sns, ) (Entered: May 20, 2008) (1 pg).
Summons Returned Executed by SOITEC Silicon on Insulator Technologies SA, Commissariat a LEnergie Atomique. MEMC Electronic Materials Inc. served on May 19, 2008, answer due Jun. 9, 2008. (Kraft, Denise) (Entered: May 20, 2008) (2 pgs).
Motion for Pro Hac Vice Appearance of Attorney George W. Neuner, Alan M. Spiro, Brian M. Gaff and Carolyn D'Agincourt—filed by SOITEC Silicon on Insulator Technologies SA, Commissariat a LEnergie Atomique. (Attachments: # 1 Certificate of Compliance Certification by Counsel To Be Admitted Pro Hac Vice, # 2 Certificate of Compliance Certification by Counsel To Be Admitted Pro Hac Vice, # 3 Certificate of Compliance Certification by Counsel to Be Admitted Pro Hac Vice, # 4 Certificate of Compliance Certification by Counsel to Be Admitted Pro Hac Vice, # 5 Certificate of Service)(Kraft, Denise) (Entered: May 23, 2008) (6 pgs).
Stipulation to Extend Time Answer to Complaint to Jul. 9, 2008—filed by MEMC Electronic Materials Inc.. (Rogowski, Patricia) (Entered: Jun. 5, 2008) (1 pg).
Motion for Pro Hac Vice Appearance of Attorney Robert M. Evans, Jr., David W. Harlan, Richard L. Brophy, Marc W. Vander Tuig—filed by MEMC Electronic Materials Inc.. (Attachments: # 1 Certification of Robert M. Evans, Jr., # 2 Certification of David W. Harlan, # 3 Certification of Richard L. Brophy, # 4 Certification of Marc W. Vander Tuig)(Rogowski, Patricia) (Entered: Jun. 9, 2008) (6 pgs).
Motion for Pro Hac Vice Appearance of Attorney Michael L. Brody, Richard P. Gilly, Gail J. Standish, Marcus T. Hall and Jason S. Charkow—filed by SOITEC Silicon on Insulator Technologies SA. (Attachments: # 1 Certification by Counsel to be Admitted Pro Hac Vice, # 2 Certification by Counsel to be Admitted Pro Hac Vice, # 3 Certification by Counsel to be Admitted Pro Hac Vice, # 4 Certification by Counsel to be Admitted Pro Hac Vice, # 5 Certification by Counsel to be Admitted Pro Hac Vice)(Kraft, Denise) (Entered: Jun. 10, 2008) (8 pgs).
Disclosure Statement pursuant to Rule 7.1 filed by SOITEC Silicon on Insulator Technologies SA, Commissariat a LEnergie Atomique. (Attachments: # 1 Certificate of Service)(Kraft, Denise) (Entered: Jun. 16, 2008) (3 pgs).
Motion to Dismiss Based upon or, in the Alternative, Motion for a More Definite Statement—filed by MEMC Electronic Materials Inc.. (Rogowski, Patricia) (Entered: Jul. 9, 2008) (4 pgs).
Opening Brief in Support re 10 Motion to Dismiss Based upon or, in the Alternative, Motion for a More Definite Statement filed by MEMO Electronic Materials Inc..Answering Brief/Response due date per Local Rules is Jul. 28, 2008. (Rogowski, Patricia) (Entered: Jul. 9, 2008) (15 pgs).
Disclosure Statement pursuant to Rule 7.1 filed by MEMC Electronic Materials Inc.. (Rogowski, Patricia) (Entered: Jul. 9, 2008) (3 pgs).
Answering Brief in Opposition re 10 Motion to Dismiss Based upon or, in the Alternative, Motion for a More Definite Statement filed by Commissariat a LEnergie Atomique.Reply Brief due date per Local Rules is Aug. 7, 2008. (Attachments: # 6 Exhibit A, # 7 Exhibit B, # Certificate of Service) (Kraft, Denise) (Modified on Jul. 29, 2008 (lid). (Entered: Jul. 28, 2008) (29 pgs).
Sealed Reply Brief re 10 Motion to Dismiss Based upon or, in the Alternative, Motion for a More Definite Statement filed by MEMC Electronic Materials Inc.. (Rogowski, Patricia) (Entered: Aug. 7, 2008) Redacted Reply Brief re 14—re 10 Motion to Dismiss Based upon or, in the Alternative, Motion for a More Definite Statement filed by MEMC Electronic Materials Inc.. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).
Memorandum Order denying 10 Motion to Dismiss Based upon or, in the Alternative, Motion for a More Definite Statement filed by MEMC Electronic Materials Inc., Order, Setting Hearings Telephonic Scheduling Conference set for Mar. 12, 2009 at 9:00 A.M. Signed by Judge Sue L. Robinson on Feb. 20, 2009. (nmf) (Entered: Feb. 20, 2009) (6 pgs).
Motion for Pro Hac Vice Appearance of Attorney B. Scott Eidson— filed by MEMC Electronic Materials Inc.. (Attachments: # 1 Exhibit Certification by Counsel to be Admitted Pro Hac Vice)(Rogowski, Patricia) (Entered: Feb. 23, 2009) (4 pgs).
Notice of Service of Plaintiffs' Initial Disclosures Pursuant to Fed. R. Civ. P. 26(a)(1) by SOITEC Silicon on Insulator Technologies SA, Commissariat a LEnergie Atomique. (Attachments: # 1 Certificate of Service) (Kraft, Denise) (Entered: Feb. 27, 2009) (4 pgs).
Answer to 1 Complaint, with Jury Trial Demanded, Counterclaim against all plaintiffs by MEMC Electronic Materials Inc.. (Attachments: # 1 Exhibit A)(Rogowski, Patricia) (Entered: Mar. 6, 2009) (55 pgs).
Notice of Service of MEMC Electronic Materials, Inc.'s Initial Disclosures by MEMC Electronic Materials Inc..(Rogowski, Patricia) (Entered: Mar. 6, 2009) (3 pgs).
Proposed Order Proposed Scheduling Order re 16 Memorandum and Order Set Hearings, by SOITEC Silicon on Insulator Technologies SA, Commissariat a LEnergie Atomique. (Kraft, Denise) (Entered: Mar. 10, 2009) (7 pgs).
Letter to the Honorable Sue L. Robinson from Denise Seastone Kraft, Esq. regarding [Proposed] Scheduling Order—re 21 Proposed Order, 16 Memorandum and Order Set Hearings,. (Kraft, Denise) (Entered: Mar. 10, 2009) (1 pg).
Stipulation to Extend Time to Respond or Otherwise Plead to Defendant's Counterclaim to Apr. 7, 2009—filed by SOITEC Silicon on Insulator Technologies SA, Commissariat a LEnergie Atomique. (Attachments: # 1 Certificate of Service)(Kraft, Denise) (Entered: Mar. 11, 2009) (2 pgs).
Proposed Order Revised Scheduling Order re 21 Proposed Order, 16 Memorandum and Order Set Hearings, by SOITEC Silicon on Insulator Technologies SA, Commissariat a LEnergie Atomique. (Kraft, Denise) (Entered: Mar. 12, 2009) (7 pgs).
Letter to the Honorable Sue L. Robinson from Denise Seastone Kraft regarding Revised Scheduling Order Pursuant to 03/12/09 Telephonic Scheduling Conference—re 24 Proposed Order. (Kraft, Denise) (Entered: Mar. 12, 2009) (1 pg).
Scheduling Order: Case referred to the Magistrate Judge for the purpose of exploring ADR. Joinder of Parties due by Aug. 14, 2009. Amended Pleadings due by Aug. 14, 2009. Discovery due by Apr. 23, 2010. Discovery Conference set for Jun. 25, 2009 04:30 Pm in Courtroom 6B before Judge Sue L. Robinson. Dispositive Motions due by Jun. 25, 2010. Answering Brief due Jul. 16, 2010. Reply Brief due Jul. 30, 2010. Oral Argument set for Aug. 27, 2010 09:30 Am in Courtroom 6B before Judge Sue L. Robinson. Claim Construction Opening Briefs due by Jun. 18, 2010. Response Briefs due Jul. 9, 2010. Final Pretrial Conference set for Oct. 14, 2010 04:30 PM in Courtroom 6B before Judge Sue L. Robinson. Jury Trial set for Oct. 25, 2010 09:30 AM in Courtroom 6B before Judge Sue L. Robinson. Signed by Judge Sue L. Robinson on Mar. 16, 2009. (nmf) (Entered: Mar. 16, 2009) (7 pgs).
Order Setting Teleconference: Telephone Conference set for Mar. 23, 2009 at 11:00 AM before Judge Mary Pat Thynge to discuss ADR. Signed by Judge Mary Pat Thynge on Mar. 16, 2009. (cak) (Entered: Mar. 16, 2009) (4 pgs).
Order Setting Teleconference: a teleconference has been scheduled for Monday, Jun. 1, 2009 at 10:00 a.m. with Magistrate Judge Thynge to discuss the status of the case and the parties negotiations. Counsel for MEMC shall initiate the teleconference call to 302-573-6173. It is Further Ordered that the Court is holding Sep. 10, Sep. 14 and Sep. 15, 2009 as possible mediation dates. Counsel are to advise Judge Thynge by Mar. 30, 2009 if any of these dates works for everyone to schedule the mediation. Signed by Judge Mary Pat Thynge on Mar. 23, 2009. (cak) (Entered: Mar. 23, 2009) (2 pgs).
Order Setting Mediation Conferences: Mediation Conference Tentatively set for Sep. 15, 2009 at 10:00 AM in Courtroom 2B before Judge Mary Pat Thynge. See order for details. Signed by Judge Mary Pat Thynge on Mar. 24, 2009. (cak) (Entered: Mar. 24, 2009) (6 pgs).
Motion to Dismiss Based upon Fed. R. Civ. P. 12(b)(1) and (6) and Article III of the United States Constitution—filed by SOITEC Silicon on Insulator Technologies SA, Commissariat a LEnergie Atomique. (Attachments: # 1 Text of Proposed Order, # 2 Certificate of Service)(Kraft, Denise) (Entered: Apr. 7, 2009) (5 pgs).
Opening Brief in Support re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution filed by SOITEC Silicon on Insulator Technologies SA, Commissariat a LEnergie Atomique.Answering Brief/Response due date per Local Rules is Apr. 27, 2009. (Attachments: # 1 Certificate of Service)(Kraft, Denise) (Entered: Apr. 7, 2009) (13 pgs).
Answer to 19 Answer to Complaint, Counterclaim Partial Answer to Defendant's Counterclaims, Affirmative Defenses and Soitec Counterclaims, Counterclaim against MEMC Electronic Materials Inc. by SOITEC Silicon on Insulator Technologies SA, Commissariat a LEnergie Atomique. (Attachments: # 1 Certificate of Service)(Kraft, Denise) (Entered: Apr. 7, 2009) (18 pgs).
Notice of Service of First Request for Production of Documents and Things Directed to Commissariat a L'Energie Atomique; First Request for Production of Documents and Things Directed to SOITEC Silicon on Insulator Technologies, S.A. and Soitec USA, Inc.; and First Set of Interrogatories Directed to SOITEC Silicon on Insulator Technologies, S.A., Soitec USA, Inc. and Commissariat a L'Energie Atomique by MEMC Electronic Materials Inc.. (Rogowski, Patricia) (Entered: Apr. 14, 2009) (3 pgs).
Stipulation to Extend Time Defendant to File Answering Brief in Opposition to Plaintiffs' Partial Motion to Dismiss Counterclaim Counts II, III, IV, V, and VIII to May 6, 2009—filed by MEMC Electronic Materials Inc.. (Rogowski, Patricia) (Entered: Apr. 21, 2009) (3 pgs).
Answer to 32 Answer to Counterclaim,,, of S.O.I. TEC Silicon on Insulator Technologies, S.A. And SOITEC U.S.A., Inc. By MEMC Electronic Materials Inc..(Rogowski, Patricia) (Entered: Apr. 23, 2009) (4 pgs).
Stipulation to Extend Time Answering Brief in Opposition to Plaintiffs' Partial Motion to Dismiss Counterclaim Counts II, III, IV, V and VIII to May 15, 2009—filed by MEMC Electronic Materials Inc.. (Rogowski, Patricia) (Entered: May 6, 2009) (3 pgs).
Notice of Service of Soitec's First Set of Interrogatories (Nos. 1-17) and Soitec's First Set of Requests for Production of Documents and Things (Nos. 1-132) by SOITEC Silicon on Insulator Technologies SA, Commissariat a LEnergie Atomique. (Attachments: # 1 Certificate of Service)(Kraft, Denise) (Entered: May 6, 2009) (2 pgs).
Stipulation to Extend Time for Defendant to File an Answering Brief in Opposition to Plaintiffs' Partial Motion to Dismiss Counterclaim Counts II, III, IV, V, and VIII; and Stipulation to Extend Time for Plaintiffs to File Responses to MEMC's First Requests for Production of Documents and to MEMC's First Set of Interrogatories to May 29, 2009—filed by SOITEC Silicon on Insulator Technologies SA, Commissariat a LEnergie Atomique. (Attachments: # 1 Certificate of Service)(Kraft, Denise) (Entered: May 13, 2009).
Notice of Service of (1) Subpoena to Hayes Soloway, P.C., (2) Subpoena to Pearne & Gordon, LLP, (3) Subpoena to Brinks Hofer Gilson & Lione, and (4) Subpoena to Winston & Strawn by MEMC Electronic Materials Inc. (Rogowski, Patricia) (Entered: May 14, 2009) So Ordered- re 38 Stipulation to Extend Time.Set Briefing Schedule: re 30 Motion to Dismiss. (Answering Brief due May 29, 2009.) (Refer to Stipulation for Further Details.). Signed by Judge Sue L. Robinson on May 15, 2009. (lid) (Entered: May 15, 2009).
Stipulation to Extend Time for Defendant to File Its Answering Brief until Jun. 5, 2009 by MEMC Electronic Materials Inc.. (Rogowski, Patricia) (Entered: May 28, 2009) So Ordered, re 40 Stipulation, Set Briefing Schedule: re 30 Motion to Dismiss Based upon Fed. R. Civ. P. 12(b)(1) and (6) and Article III of the United States Constitution. (Answering Brief due Jun. 5, 2009.). Signed by Judge Sue L. Robinson on May 29, 2009. (nmf) (Entered: May 29, 2009).
Notice of Service of (1) Soitecs Objections and Responses to MEMC's First Set of Interrogatories; (2) Soitecs Objections and Responses to MEMC's First Request for Production of Documents and Things; (3) CEAs Objections and Responses to MEMC's First Set of Interrogatories; and (4) CEAs Objections and Responses to MEMC's First Request for Production of Documents and Things by SOITEC Silicon on Insulator Technologies SA, Commissariat a LEnergie Atomique. (Attachments: # 1 Certificate of Service) (Kraft, Denise) (Entered: May 29, 2009).
Agarwal, Aditya et al. "Efficient Production of Silicon-On-Insulator Films by Co-Implantation of He$^+$ with H$^+$"—Proceedings 1997 IEEE International SOI Conference, Oct. 1997—pp. 44-45.
Ahn, K. Y., et al., "Growth, Shrinkage, and Stability of Interfacial Oxide Layers Between Directly Bonded Silicon Wafers", *Applied Physics A.*, vol. 50, 1990, pp. 85-94.
Alley et al., "Surface Roughness Modification of Interfacial Contacts in Polysilicon Microstructures", Proceedings of the 7$^{th}$ International Conference on Solid-State Sensors and Actuators, *Transducers '93*, PACIFICO, Yokohama Japan. Jun. 7-10, 1993, pp. 288-291.
Almedia et al. "Bond formation in ion beam synthesized amorphous gallium nitride", *Elsevier, This Solid Films*, 343-344 1999, pp. 632-636.
Ascheron, C., "A Comparative Study of Swelling, Radiation, Strain and Radiation Damage of High-Energy Proton-bombarded GaAs, GaP, InP, SI and Ge Single Crystals, Nuclear Instruments and Methods in Physics Research",*Nuclear Instruments and Methods in Physics Research* B36, (1989), 163-172.
Ascheron, C., "A Study of Proton Bombardment Induced Swelling of GaP Single Crystals", *Phys. stat. sol.* (a) 92, (1985), pp. 169-176.
Ascheron, C., "Gettering a Copper in Proton-and Helium-Bombarded Buried Regions of Gallium Phosphide", *Phys. stat. sol.* (a), vol. 106, 1988, pp. 73-79.
Ascheron, C., "Investigations of Hydrogen Implanted GaP Single Crystals by Means of Particle Induced 7-Spectroscopy, Infrared Spectroscopy, and Turyherford Backscattering Channeling Technique" *Phys. stat. sol.* (a) 89, (1985), pp. 549.
Ascheron, C., "Proton Beam Modification of Selected AIIIBV Compounds", *Phys. stat. sol.* (a) 124, (1991), pp. 11.
Ascheron, C., "Swelling, Strain, and Radiation Damage of He+ Implanted GaP", *Phys. stat. sol.* (a) 96, 1986, pp. 555-562. (1986).
Asheron, C., "The Effect of Hydrogen Implantation Induced Stress on GaP Single Crystals", *Nuclear Instruments and Methods in Physics Research*, B28 (1987), pp. 350-359.
Aspar et al., "The Generic Nature of the Smart-Cut© Process for Thin-Film Transfer", *Journal of Electronic Materials*, vol. 30, No. 7, Mar. 2001, pp. 834-840.
Aspar et al., Smart-Cut®: The basic fabrication process for UNIBOND® SOI wafers, *SEMI* 1996, pp. 37-46.
Aspar, B. "Basic Mechanisms Involved in the Smart-Cut Process", 1997, pp. 223-240.
Aspar, B. et al, "Characterization of SOI substrates: Application to Recent SIMOX and Unibond Wafers," *Electrochemical Society Proceedings*, vol. 96-3, pp. 99-111, Jan. 1996.
Aspar, B. et al, "Transfer of Structured and Patterned Thin Silicon Films Using the Smart-Cut Process", 1996, pp. 1985-1986.
Aspar, B. Et al., "Ultra Thin Buried Oxide Layers Formed by Low Dose SIMOX Processes", Proc. 6$^{th}$ International Conference on SOI Technology and Devices, *Electro. Soc.*, vol. 94, No. 11, 1994, pp. 62-69.
Aspar, B. et al., "Smart Cut—Process Using Metallic Bonding: Application to Transfer of Si, GaAs, InP Thin Films", Electronic Letters—Jun. 10, 1999, vol. 35, No. 12., pp. 1024-1025.
Ashurst et al., "Water Level Anti-Silicon Coatings for MEMS", Sensors and Actuators A104, 2003, pp. 213-221.

Auberton-Herve, A. J. et al, "A New Sal Material: Smart-Cut", 1996, pp. 214-219.
Auberton-Herve et al., "SOI Materials for ULSI Applications", *Semiconductor International*, Oct. 1995, 5 pages.
Auberton-Herve, "Why Can Smart Cut® Change the Future of Microelectronics?" published in International Journal of High Speed Electronics and Systems, vol. 10, No. 1 (2000) pp. 131-146.
Ayguavives et al., "Physical Properties of (Ba,Sr) TiO$_3$ Thin Films Used for Integrated Capacitors in Microwave Applications", IEEE 2001.
Blanchard-Lagahe C. et al., "Hydrogen and Helium Implantation to Achieve Layer Transfer" vol. 19, pp. 346-358, 2003, *Semiconductor Wafer Bonding VII: Science, Technology, and Applications—Proceedings of the International Symposium*.
Blöchl P.E. et al., First-Principles Calculations of Diffusion Coefficients: Hydrogen in Silicon, *Physical Review Letters*, vol. 64, No. 12, 1990, pp. 1401-1404.
Borgati, Stephen P., "The Root-Mean-Square", Boston College, Nov. 16, 1998, Obtained from the Internet at: <http://www.analytictech.com/mb313/rootmean.htm>.
Bruel, Michel, "Application of Hydrogen Ion Beams to Silicon on Insulator Material Technology", *Nuclear Instruments and Methods in Physics Research*, B108, 1996, pp. 313-319.
Bruel, M. et al., "Smart-Cut: A New Silicon on Insulator Material Technology Based on Hydrogen Implantation and Wafer Bonding", 1997, pp. 1636-1641, col. 36, Part 1, No. 3B.
Bruel, M. "Smart-Cut Process: The Way to Unibond S.O.I. Wafers", 1996, pp. unknown.
Bruel, M. et al, "Smart-Cut": A Promising New SOI material technology, *Proceedings 1994 IEEE, International Sal Conference*, Oct. 1995, pp. 178-179.
Bruel, M. et al, "Smart-Cut—a new SOI Material Technology based on hydrogen Implantation and wafer bonding," *CEA*, 1996, 24 pages.
Bruel, M., "Silicon on insulator Material Technology", *Electronic Letters*; 31 Jul. 6, 1995; No. 14; pp. 1201-1202.
Bruel, "Silicon-an-Insulator", *European Semiconductor*, Mar. 1997.
Canham et al. "Radiative Recombination Channels due to Hydrogen in Crystalline Silicon", *Materials Science and Engineering*, B4 (1989) pp. 41-45.
Carter et al., "Applications of Ion Beams to Materials", *Inst. Phys. Conf. Ser.*, No. 28, Chapter 1, 1976, pp. 30-36.
Carter, G. et al., The Collection of Ions Implanted in Semiconductors: II Range Distributions Derived From Collection and Sputter-Etch Curves, *Radiation Effects*, 1972, vol. 16, pp. 107-114.
Cassidy, Victor M., "Ion Implantation Process Toughens Metalworking Tools," *Modern Metals*, 1984, pp. 65-67.
Cerofolini et al., "Hydrogen-Related Complexes as the Stressing Species in High-Fluence, Hydrogen-Implanted, Single-Crystal Silicon" *Physical Review B*, vol. 46, No. 4, 1992, pp. 2061-2070.
Cerofolini et al., "Hydrogen and Helium Bubbles in Silicon", *Material Science and Engineering 2000—Reports: A Review Journal*, Published by Elsevier Science S.A. 2000, pp. 1-52.
Chu et al, "Radiation Damage of 50-250 keV Hydrogen Ions in Silicon", *Ion Implantation in Semiconductors*, eds. F. Chernob et al., Plenum New York 1976, pp. 483-492.
Chu, et al. "Ion Implantation in Semiconductors", Chernow, Borders and Brice, Pirnum Press, New York and London. Radiation Damage of 50-250 keV Hydrogen Ions in Silicon, 1976, pp. 483-491.
Chu, P.K. et al., "Plasma Immersion Ion Implantation—A Fledgling Technique for Semiconductor Processing", Materials Science and Engineering Reports, *A Review Journal*, vol. R17, Nos. 6-7, Nov. 30, 1996, pp. 207-280.
Cowern, N. et al., "Transport Diffusion of Ion-Implanted B In Si: Dose, Time, and Matrix Dependence of Atomic and Electrical Profiles", *J. Appl. Phys.*, vol. 68, No. 12, 1990, pp. 6191-6198.
Cristoloveanu, S. et al, "Electrical Properties of Unibond Material", *Electrochemical Society Proceedings*, vol. 96-3, pp. 142-147, 1996.
Csepregl, L. et al. "Regrowth Behavior of Ion-Implanted Amorphous Layers on <111> Silicon", *Applied Physics Letters*, vol. 2, 1976, pp. 92-93.

Cullis, A.G. et al. "Comparative study of annealed neon-, argon-, and krypton-ion implantation damage in silicon," *J. Appl. Phys.*, 49(10), Oct. 1978, pp. 5188-5198.

Denteneer, P. et al., Hydrogen Diffusion and Passivation of Shallow Impurities in Crystalline Silicon, *Materials Science Forum*, Trans Tech Publications, Switzerland, vols. 38-41, 1989, pp. 979-984.

Denteneer, P. et al., "Structure and Properties of Hydrogen-Impurity Pairs in Elemental Semiconductors", *Physical Review Letters*, vol. 62, No. 16, 1989, pp. 1884-1888.

Di Cioccio, L. et al., "*Silicon Carbide on Insulator Formation by the Smart Cut® Process*".—Materials Science and Engineering B46 (1997)—(pp. 349-356).

DiCioccio, et al.," Silicon carbide on Insulator formation using the Smart Cut process", *Electronics Letters*, vol. 32, No. 12, Jun. 6, 1996, pp. 1144-1145.

Diem et al., "SOI 'SIMOX': From Bulk to Surface Micromachining, A New Age for Silicon Sensors and Actuators", *Sensors and Actuators*, vol. A 46-47, 1995, pp. 8-16.

Dirks, A. G. et al., "Columnar Microstructure in Vapor DEuropesited Thin Films", *Thin Solid Films*, vol. 47, 1977, pp. 219-233.

Donohue et al., "Pulse-Extended Excimer Laser Annealing of Lead Zirconate Titanate Thin Films", Proceedings of the 12th International Symposium on Integrated Ferroelectrics, Aachen, Germany, Mar. 2000, *Integrated Ferroelectics*, vol. 31, pp. 285 to 296, 2000.

Duo, et al., "Comparison Between the different Implantation orders in H+ and He+ Co-implantation", *J. Phys. D. Appl. Phys.* vol. 34, 2001, pp. 477-482.

Duo, et al., "Evolution of Hydrogen and Helium Co-Implanted Single-Crystal Silicon During Annealing", 2001 American Institute Physics—Journal of Applied Physics, vol. 90, No. 8, Oct. 15, 2001, pp. 3780-3786.

Eaglesham, White, Feldman, Moriya and Jacobson, "Equilibrium Shape of Si," *Physical Review Letters*, vol. 70, No. 11, Mar. 15, 1993, pp. 1643-1646.

EerNisse, E., "Compaction of ion-implanted fused silica", *Journal of Applied Physics*, vol. 45, No. 1, Jan. 1974.

EerNisse, E.P., "Role of Integrated Lateral Stress in Surface Deformation of He-Implanted Surfaces" *Journal of Applied Physics*, vol. 48, No. 1, Jan. 1977, pp. 9-17.

Evans, J.H., "An Interbubble Fracture Mechanism of Blister Formation on Helium-Irradiated Metals" *Journal of Nuclear Materials*, 68, 1977, pp. 129-140.

Fujitsuka et al., "A New processing Technique to Prevent Stiction Using Silicon Selective Etching for SOT-MEMS", *Sensors and Actruators*, A97-98, 2002, pp. 716-719.

Garnier, D. M., "The Fabrication of a Partial Soi Substrate", Proceedings of the 9th International Symposium on Silicon on Isolator Technology and Devices, vol. 99, Chap. 54, 1990, 73-78.

Gerasimenko, N., "Infrared Absorption of Silicon Irradiated by Protons", *Phys. stat.sol.* (b) 90, (1978), pp. 689-695.

Ghandi, Sorab, "VLSI Fabrication Princiles-Silicon and Gallium Arsenide", *Rensselaer Polytechnic Institute*, 1983, John Wiley & Sons publishers, pp. 135.

Goesele et al., "Semiconductor Wafer Bonding", Science and Technology, ECS Series, *Annual Review of Material Science*, vol. 28, New Jersey, 1999, pp. 215-241.

Greenwald, A.C., "Pulsed-electron-beam annealing of ion-implantation damage", *J. Appl. Phys.* 50(2), Feb. 1978, pp. 783-786.

Grovenor, C.R.M., *Microelectronic Materials*, pp. 73-75 (1989).

Guilhalmenc, C. et al, "Characterization by Atomic Force Microscopy of the Soi Layer Topography in Low Dose Simox Materials", *Materials Science and Engineering*, B46, 1997, pp. 29-32.

Haisma et al., Silicon-on-Insulator Wafer Bonding-Wafer Thinning Technological Evaluations, *JAPANese Journal of Applied Physics*, 28, 1989, Aug., No. 8, Part 1, Tokyo, Japan, pp. 1426-1443.

Hamaguchi et al., "Device Layer Transfer Technique using Chemi-Mechanical Polishing", *JAPANese Journal of Applied Physics*, 23,(1984), Oct., No. 10, Part 2, Tokyo, Japan, pp. L815-L817.

Heistand et al., "Advances in Passive Integration for C/RC Arrays & Networks with Novel Thin & Thick Film Materials", 36th Nordic IMAPS Conference, Helsinki, 1999.

Hendrix et al., "Low-Temperature Process for High-Density Thin-Film Integrated Capacitors", International Conference on High-Density Interconnect and Systems Packaging, 2000.

Huang, et al., Calculation of critical layer thickness considering thermal strain in $Si_{1-x}Ge_x/Si$ strained-layer heterostructures, J. Appl. Phys. 83 (1), Jan. 1, 1998.

Hulett, D.M. et al., "Ion Nitriding and Ion Implantation: A Comparison," *Metal Progress*, 1985, pp. 18-21.

IBM Technical Disclosure Bulletin, *Isolation by Inert Ion Implantation*, 1986, vol. 29 No. 3, pp. 1416.

IBM Technical Disclosure Bulletin, *SOI Interposer Structure XP000627972*, Jul. 1996, vol. 39 No. 7, pp. 1-5.

Jalaguier, E. et al., "*Transfer of Thin InP Films Onto Silicon Substrate by Proton Implantation Process*".—11th International Conference on Indium Phosphide and Related Materials May 16-20, 1999—Davos, Switzerland. (pp. 26-27).

Jalaguier, E. et al., "*Transfer of 3in GaAs Film on Silicon Substrate by Proton Implantation Process*".—(2 pgs).

Jaussaud, C. et al., Microstructure of Silicon Implanted With High Dose Oxygen Ions, *Appl. Phys. Lett.*, vol. 48, No. 11, 1985, pp. 1064-1066.

Jenei et al., "High-Q Inductors and Capacitors on Si Substrate", IEEE 2001.

Johnson, "High Fluence Deuteron Bombardment of Silicon", *Radiation Effects*, vol. 32, pp. 159-167, 1977.

Jones, K. S. et al., "A Systematic Analysis of Defects In Ion Implanted Silicon", *Applied Physics A*., vol. 45, 1988 pp. 1-34.

Jones et al., "Enhanced elimination of implantation damage upon exceeding the solid solubility", *J. App. Phys.*, vol. 62, No. 10, 1987, pp. 4114-4117.

Kamada et al, Observation of Blistering and Amorphization on Germanium Surface After 450 keV Ar+ION Bombardment, *Radiation Effects*, vol. 28, 1976, pp. 43-48.

Kim et al., "A Porous-Si-based Novel Isolation Technology for Mixed-Signal Integrated Circuits", Symposium on VLSI Technology, 2000.

Klem, J.F., "Characteristics of Lift-Off Fabricated AlGaAs/InGaAs Single-Strained-Quantum Well Structures on Glass and Silicon Substrates", *Inst. Phys. Conf.* Ser. No. 96: Chapter 6, (1989), pp. 387-392.

Komarov et al., Crystallographic Nature and Formation Mechanisms of Highly Irregular Structure in Implanted and Annealed 51, Layers*Radiation Effects*, vol. 42, 1979, pp. 169-178.

Laporte A. et al., "Charged Defects at the Interface Between Directly Bonded Silicon Wafers" —Applied Physics, vol. 36 (Sep. 1997) pp. 5502-5506-Part 1, No. 9A.

Li, J., "Novel Semiconductor Substrate Formed by Hydrogen Ion Implantation into Silicon," Appl. Phys. Lett., vol. 55, No. 21, Nov. 20, 1989, pp. 2223-2224.

Ligeon, E., "Hydrogen Implantation in Silicon Between 1.5 and 60 KeV", *Radiation Effects* 1976, vol. 27, pp. 129-137.

Liu et al., "Investigation of Interface in Silicon-On-Insulator by Fractual Analysis", *Applied Surface Science*, vol. 187, Feb. 28, 2002, pp. 187-191.

Liu et al., "Integrated Thin Film Capacitor Arrays", International Conference on High Density Packaging and MCMs, 1999.

Lu, X., et al., "SOI Material Technology Using Plasma Immersion ION Implantation", Proceedings 1996 IEEE International SOI Conference, Oct. 1996, pp. 48-49.

Maleville, C. et al, "Physical Phenomena involved in the Smart-Cut Process", *Electrochemical Society Proceeding*, vol. 96-3, 1996—pp. 34-46.

Maleville, C. et al, "Wafer Bonding and Hi-Implantation Mechanisms Involved in the Smart-Cut Technology", 1997, pp. 14-19.

Manuaba, A., "Comparative Study on Fe32Ni36CrI4P12B 6 Metallic Glass and its Polycrystalline Modification bombarded by 2000 keV Helium Ions with High Fluence" *Nuclear Instruments and Methods*, (1982) pp. 409-419.

Mastrangelo, C. et al., "Suppression of Stiction in MEMS", *Proceedings of the Materials Research Society Seminar*, vol. 605, 2000, pp. 1-12.

Matsuda et al., "Large Diameter Ion Beam Implantation System," *Nuclear Instruments and Methods*, vol. B21, 1987, pp. 314-316.

Matsuo et al., "Abnormal solid solution and activation behavior in Ga-implanted Si(100)", *Appl. Phys. Lett.*, vol. 51, No. 24, 1987, pp. 2037-2039.

Mishima, Y. and T. Yagishita, T. "Investigation of the bubble formation mechanism in a-Si:H films by Fourier-transform infrared microspectroscopy" *J. Appl. Phys.*, vol. 64, No. 8, Oct. 15, 1988, pp. 3972-3974.

Miyagawa, S. et al, "Helium Reemission During Implantation of Silicon Carbide", *J. Appl. Phys.*, 54 (5), May 1983, pp. 2302-2306.

Miyagawa, S., "Surface structure of silicon carbide Irradiated with helium ions with mono energy and continuous energy distributions" *J. Appl. Phys.* 53(12), Dec. 1982, pp. 8697-8705.

Monemar, B. "Shallow Impurities in Semiconductors 1998", Proceedings of the Third International Conference in Sweden, Aug. 10-12, 1988, No. 95, pp. 493-499.

Moreau, Wayne M., "Semiconductor Lithography, Principles, Practices, and Materials," Plenum Press, 1988. Table of Contents only.

Moriceau, H. et al, A New Characterization Process Used to Qualify SOI Films 1991 pp. 173-178.

Moriceau, H. et al, "A New Characterization Process Used to Qualify SOI Films", Electrochemical Society Proceedings, vol. 99-3, 1999 pp. 173-178.

Moriceau, H. et al, "A New Characterization Process Used to Qualify SOI Films", Abstract No. 405, Meeting Abstracts, The Electrochemical Society, Inc., vol. 99-1, Seattle, May 2-6, 1999, 2 pages.

Moriceau, H. et al. "Cleaning and Polishing As Key Steps for Smart-Cut SOI Process", Proceedings 1996 IEEE Soi Conference, Oct. 1996.

Moriceau, H. et al, "The Smart-Cut Process as a Way to Achieve Specific Film Thickness in Sal Structures", 1997, pages unknown.

Motohiro et al. "*Geometrical Factors of Argon Incorporation in SiO$_2$ Films Deposited by Ion Beam Sputtering*"—Thin Solid Films, Elsevier-Sequoia S.A. Lausanne, CH, vol. 120, No. 4-Oct. 1, 1984, pp. 313-327.

Munteanu, D. et al, "Detailed Characterization of Unibond Material", 1997, pp. 395-398.

Myers, D. R., "The effects of Ion-Implantation damage on the first order Raman spectra GaPa)" *J. Appl. Phys.* 54(9), Sep. 1977.

Nethling. J. et al, "Identification of Hydrogen Platelets in ProtonBombarded GaAs", 1985, pp. 941-945.

Nichols C. S et al., "Properties of Hydrogen in Crystalline Silicon Under Compression and Tension", *Physical Review Letters*, vol. 63, No. 10, 1989, pp. 1090-1093.

Nicoletti, S. et al., "Bi-Epitaxial YBCO Grain Boundry Josephson Junctions on SrTiO3 and Sapphire Substrates", *Physics C269*, 1996, pp. 255-267.

Ono et al., "Orientation Dependence of Flaking of Ion Irradiated Aluminum Single Crystals", *Japanese Journal of Applied Physics*, vol. 25, No. 10, 1986, pp. 1475-1480.

Paszti, E, "Flaking and Wave-Like Structure on Metallic Glasses Induced by MeV-Energy Helium Ions", *Nuclear Instruments and Methods*, vol. 209/210, (1983), pp. 273-280.

Picraux, S. Thomas et al., "Ion Implantation of Surfaces," *Scientific American*, vol. 252, No. 3, pp. 102-113 1985.

Popov, V.P. et al., "Blistering on a Silicon Surface in the Process of Sequential Hydrogen/Helium ION Co-Iplantation"—Optoelecironics Instrumentation and Data Processing, No. 3, Apr. 5, 2001—pp. 90-98—2001.

Primak, W., "Impurity Effect in the Ionization Dilation of Vitreous Silica" *J. Appl. Phys.* 39(13) 1968.

Ray et al. "*Effect of Reactive-Ion Bombardment on the Properties of Silicon Nitride and Oxynitride Films Deposited by Ion-Beam Sputtering*"—Journal of Applied Physics, vol. 75, No. 12, Jun. 15, 1994—pp. 8145-8152.

Renier, M. et al., "A New Low-Energy Ion Implanter for Bombardment of Cylindrical Surfaces," *Vacuum*, vol. 35, No. 12, pp. 577-578, 1985.

Roozeboom et al., "High-Value MOS Capacitor Arrays in Ultradeep Trenches in Silicon", *Microelectronic Engineering*, vol. 53, pp. 581 to 584, Elsevier Science 2000.

Roth, J., "Blistering and Bubble Formation" *Inst. Phys. Conf*Ser. No. 28, 1976: Chapter 7, pp. 280-293.

Sah, Chih -Tang et al., "Deactivation of the Boron Acceptor in Silicon by Hydrogen," *Appl. Phys. Lett.* 43, (2), Jul. 1983, pp. 204-206.

Saint-Jacques R. G., "La Formation des Cloques", *Nuclear Instruments and Methods*, No. 209/210, North Holland Publishing Co., 1983, pp. 333-343.

Schnell et al., "Plasma Surface Texturization for Multicrystaline Silicon Solar Cells", *IEEE*, XXVIII, Photovoltaic Conference, 2000, pp. 367-370.

Shintani, A. et al., "Temperature dependence of stresses in chemical deposited vitreous films", *J. Appl. Phys.*, vol. 51, No. 8, 1980, pp. 4197.

Silicon-On-Insulator, *European Semiconductor*, Mar. 1997, pp. 17-18.

Sioshansi, Piran, "Ion Beam Modification of Materials for Industry," *Thin Solid Film*, vol. 118, 1984, pp. 61-71.

Snyman, H. C., "Transmission Electron Microscopy of Extended Crystal Defects in Proton Bombarded and Annealed GaAs", *Radiation Effects*, 1983, vol. 69, pp. 199-230.

Snyman, H. C. et al, "Void Formation in Annealed Proton-Bombarded GaAs", 1981, pp. 243-245.

Stein, Myers and Follstaedt, "Infrared Spectroscopy of chemically bonded hydrogen at voids and defects in silicon", *J. Appl. Phys.* 73(b6), Mar. 15, 1993, pp. 2755-2764.

Stephen, D., "Investigation of Lattice Strain in Proton-Irradiated GaP by a Modified Auleytner Technique" *Phys. stat. sol.* (a) 87, 1985, pp. 589-596.

Sunkara et al., "Bulk synthesis of silicon nanowires using a low-temperature vapor-liquid-solid solution", *Applied Physics Letters*, vol. 79, No. 10, Sep. 3, 2001, pp. 1546-1548.

Sze, S.M., VLSI Technology, 2.sup.nd Ed., 1988, pp. 9-10.

Tan, T. Y. et al., "On Oxygen Precipitation Retardation/Recovery Phenomena, Nucleation Incubation Phenomena and The Exigent-Accomodation-Volume Factor of Precipitation", Proceedings of the 5$^{th}$ International Symposium on Silicon Materials Science and Technology, *Semiconductor Silicon 198 Electrochem. Soc.*, New Jersey, 1986, pp. 864-873.

Terada, K. et al., "A New Dram Cell With a Transistor on a Lateral Epitaxial Silicon Layer (Tole Cell)", *IEEE Transactions on Electron Device*, vol. 37, No. 9, 1990, pp. 2052-2057.

Theodore, N. David et al., TFSOI With Improved Oxidation Resistance (to Reduce Isolation Induced Stresses and Leakage), Motorola Bulletin XP 000691920, *Technical Developments*, Nov. 1996, pp. 158-159.

Tillman et al., "Zero-Level Packaging for MEMS or MST Devices: The IRS Method", MEMS/Sensors, Advancing Microelectronics, pp. 37-39, Nov./Dec. 2000.

Tomisaka et al., "Electroplating Cu Fillings for Through-Vias for Three-Dimensional Chip Stacking" (Electronic Components and Technology Conference, 2002).

Tonini, Monelli, Cornl, Ottaviani, Frabboni, Canteri, Queirolo, "Hydrogen Interaction with phosphorus ion implantated silicon", *Ion Implantation Technology* -94, (1995) pp. 801-804.

Tzeng, J.C., "A Novel Self-Aligned Oxgyen (Salox) Implanted SOI Mosfet Device Structure" *Nuclear Instruments and Methods in Physics Research* B2, 1987, pp. 112-115.

U.S. Dept. of Energy, "The Fusion Connection: Contributions to Industry, Defense, and Basic Science Resulting From Scientific Advances Made in the Magnetic Fusion Energy Program", *Plasma Coating*, pp. 6-7, 1985.

Van de Walle, C. "Structural Identification of Hydrogen and Muonium Centers in Silicon First Principles Calculations of Hyperfine Parameters", *Physical Review Letters*, vol. 60, No. 26, 1988, pp. 2761-2764.

Van de Walle, C. "Theoretical Aspects of Hydrogen in Crystalline Semiconductors", *Physica B*, Holland, vol. 170, No. 15, 1991, pp. 21-32.

Van de Walle, C. "Theory of Hydrogen Diffusion and Reactions in Crystalline Silicon", *Physical Review Letters*, vol. 64, No. 6, 1980, pp. 669-672.

Van de Walle, C. "Theory of Hydrogen Diffusion and Reactions in Crystalline Silicon", *Physical Review B*, vol. 39, No. 15, 1989, pp. 10 791-10 808, plus diagrams.

Van Swijgenhoven et al. "Helium Bubble and Blister Formation for Nickel and An AMorphous Fe-Ni-Mo-B Alloy During 5 key He-+-Irradiation at Temperatures Between 200 K and 600", *Nuclear Instruments and Methods*, 209/210, 1983, pp. 461-468.

Veldkamp, W.B. et al., "Binary Optics," *Scientific American*, 1992, pp. 50-55.

Venezia et al., "The Role of Implantation Damage in the Production of Silicon-On-Insulator Films by Co-Implantation of He$^+$ and H$^+$", *Electrochemical Society Proceedings* vol. 98-1, 1998—pp. 1384-1395.

Weldon et al., "Mechanism of Silicon Exfoliation Induced by Hydrogen/Hekium Co-implantation", *Applied Physics Letters*, vol. 73, No. 25, pp. 3721-3723, Dec. 21, 1998.

Wemple, S.H., "Optical and channeling studies of ion-bombarded GaP", *J. Appl. Phys.*, vol. 45, No. 4, Apr. 1974, pp. 1578-1588.

Whitton, J. L. et al., "The Collection of Ions Implanted in Semiconductors: 1 Saturations Effects", *Radiation Effects*, Scotland, vol. 16, 1972, pp. 101-105.

Wiegand, M. et al., "Wafer Bonding of Silicon Wafers Covered With Various Surface Layers", *Sensors and Actuators*, Elsevier Science B.V., vol. 86, 2000, pp. 91-95.

Williams J. et al., "Annealing behaviour of high-dose rare-gas implantations into silicon", from Application of Ion Beams to Materials, 1975, Chap. 1 ,*Inst. Phys. Conf. Ser*. No. 28, 1976, pp. 30-36.

Wittmaack et al., "High Fluence Retention of Noble Gases Implanted in Silicon" *Radiation Effects*, vol. 39, 1978, pp. 81-95.

Wolf, Stanley Ph.D., Silicon Processing for the VLSI Era (vol. 2), Lattice Press, 1990, pp. 66-79.

Yamaguchi H. et al., "Intelligent Power IC With Partial Soi Structure", *Jpn. J. Appl. Phys.*, vol. 34, 1995, pp. 864-868.

Yee et al., "Polysilicon Surface-Modification Technique to Reduce Sticking of Microstructures", *Sensors and Actuators* A 52, 1996, pp. 145-150.

Yun, H. et al., "Transfer of Patterned Ion-Cut Silicon Layers", *Applied Physics Letters*, vol. 73, No. 19, 1998, pp. 2772-2774.

International Search Report for International Application No. PCT/FR1998/002904, dated Apr. 16, 1999, 2 pages.

International Search Report for International Application No. PCT/FR2002/003422, dated Jan. 22, 2003, 3 pages.

International Search Report for International Application No. PCT/FR2003/003256, dated Mar. 19, 2004, 6 pages.

International Search Report for International Application No. PCT/FR2003/003867, dated May 28, 2004, 3 pages.

International Search Report for International Application No. PCT/FR2003/003622, dated Jun. 3, 2004, 3 pages.

International Search Report for International Application No. PCT/FR2004/001858, dated Dec. 28, 2004, 3 pages.

International Search Report for International Application No. PCT/FR2004/002779, dated Apr. 5, 2005, 3 pages.

International Search Report for International Application No. PCT/FR2004/002781, dated Apr. 5, 2005, 3 pages.

International Search Report for International Application No. PCT/FR2004/001565, dated Jul. 6, 2005, 3 pages.

International Search Report for International Application No. PCT/FR2006/002184, dated Jan. 24, 2007, 2 pages.

International Search Report for International Application No. PCT/FR2007/000534, dated Nov. 22, 2007, 3 pages.

International Search Report for International Application No. PCT/FR2007/002100, dated Feb. 4, 2009, 3 pages.

International Search Report for International Application No. PCT/FR2008/001427, dated Jul. 1, 2009, 3 pages.

Office Action from U.S. Appl. No. 12/063,808, dated Apr. 6, 2010, 9 pages.

Office Action from U.S. Appl. No. 12/063,808, dated Sep. 22, 2010, 9 pages.

Office Action from U.S. Appl. No. 10/534,199, dated Feb. 19, 2009, 8 pages.

Office Action from U.S. Appl. No. 10/534,199, dated Aug. 5, 2009, 10 pages.

Office Action from U.S. Appl. No. 10/534,199, dated Jan. 20, 2010, 8 pages.

Office Action from U.S. Appl. No. 10/534,199, dated Aug. 4, 2010, 8 pages.

Office Action from U.S. Appl. No. 11/480,250, dated May 22, 2008, 10 pages.

Office Action from U.S. Appl. No. 11/480,250, dated Dec. 3, 2008, 16 pages.

Office Action from U.S. Appl. No. 11/480,250, dated Jan. 26, 2010, 14 pages.

Office Action from U.S. Appl. No. 11/480,250, dated Aug. 3, 2010, 15 pages.

Office Action from U.S. Appl. No. 12/088,047, dated Sep. 25, 2009, 9 pages.

Office Action from U.S. Appl. No. 12/088,047, dated Mar. 10, 2010, 9 pages.

Office Action from U.S. Appl. No. 10/561,299, dated Mar. 26, 2008, 9 pages.

Office Action from U.S. Appl. No. 10/561,299, dated Dec. 9, 2008, 11 pages.

Office Action from U.S. Appl. No. 10/561,299, dated May 11, 2009, 12 pages.

Office Action from U.S. Appl. No. 10/561,299, dated Nov. 16, 2009, 11 pages.

Office Action from U.S. Appl. No. 10/561,299, dated Nov. 27, 2009, 10 pages.

Office Action from U.S. Appl. No. 10/561,299, dated May 11, 2010, 11 pages.

Office Action from U.S. Appl. No. 10/565,621, dated May 15, 2007, 13 pages.

Office Action from U.S. Appl. No. 10/565,621, dated Feb. 11, 2008, 11 pages.

Office Action from U.S. Appl. No. 10/565,621, dated Sep. 12, 2008, 9 pages.

Office Action from U.S. Appl. No. 10/565,621, dated Mar. 12, 2009, 6 pages.

Office Action from U.S. Appl. No. 10/565,621, dated Jan. 7, 2010, 8 pages.

Office Action from U.S. Appl. No. 10/565,621, dated Nov. 23, 2010, 11 pages.

Office Action from U.S. Appl. No. 12/628,772, dated Oct. 7, 2010, 12 pages.

Notice of Allowance from U.S. Appl. No. 12/336,229, dated Sep. 29, 2010, 7 pages.

Notice of Allowance from U.S. Appl. No. 12/336,229, dated Jan. 10, 2011, 4 pages.

Office Action from U.S. Appl. No. 10/468,223, dated Oct. 5, 2005, 7 pages.

Office Action from U.S. Appl. No. 10/468,223, dated May 3, 2006, 11 pages.

Office Action from U.S. Appl. No. 10/468,223, dated Jan. 10, 2007, 11 pages.

Office Action from U.S. Appl. No. 10/468,223, dated Jul. 20, 2007, 11 pages.

Office Action from U.S. Appl. No. 10/468,223, dated Feb. 11, 2008, 11 pages.

Office Action from U.S. Appl. No. 10/468,223, dated Oct. 29, 2008, 11 pages.

Office Action from U.S. Appl. No. 10/468,223, dated Jun. 25, 2009, 8 pages.

Notice of Allowance from U.S. Appl. No. 10/468,223, dated Dec. 28, 2009, 4 pages.

Office Action from U.S. Appl. No. 10/474,984, dated Sep. 24, 2004, 6 pages.

Office Action from U.S. Appl. No. 10/474,984, dated Jun. 6, 2005, 5 pages.

Office Action from U.S. Appl. No. 10/474,984, dated Nov. 16, 2005, 5 pages.

Office Action from U.S. Appl. No. 10/474,984, dated May 17, 2006, 5 pages.

Office Action from U.S. Appl. No. 10/474,984, dated May 7, 2007, 9 pages.

Office Action from U.S. Appl. No. 10/474,984, dated Feb. 6, 2008, 10 pages.

Office Action from U.S. Appl. No. 10/474,984, dated Oct. 17, 2008, 11 pages.

Office Action from U.S. Appl. No. 10/474,984, dated Jul. 7, 2009, 10 pages.
Office Action from U.S. Appl. No. 10/474,984, dated Mar. 11, 2010, 13 pages.
Notice of Allowance from U.S. Appl. No. 10/474,984, dated Oct. 28, 2010, 6 pages.
Office Action from U.S. Appl. No. 10/540,303, dated Dec. 18, 2007, 6 pages.
Notice of Allowance from U.S. Appl. No. 10/540,303, dated Oct. 7, 2008, 9 pages.
Office Action from U.S. Appl. No. 11/327,906, dated Oct. 1, 2007, 5 pages.
Office Action from U.S. Appl. No. 11/327,906, dated Feb. 11, 2008, 5 pages.
Notice of Allowance from U.S. Appl. No. 11/327,906, dated Sep. 15, 2008, 6 pages.
Office Action from U.S. Appl. No. 10/975,826, dated Sep. 2, 2009, 24 pages.
Notice of Allowance from U.S. Appl. No. 10/975,826, dated Apr. 28, 2010, 8 pages.
Office Action from U.S. Appl. No. 10/492,343, dated Oct. 17, 2005, 6 pages.
Office Action from U.S. Appl. No. 10/492,343, dated Jun. 6, 2006, 13 pages.
Office Action from U.S. Appl. No. 10/492,343, dated Nov. 14, 2006, 13 pages.
Office Action from U.S. Appl. No. 10/492,343, dated May 29, 2007, 15 pages.
Office Action from U.S. Appl. No. 10/492,343, dated Feb. 7, 2008, 18 pages.
Office Action from U.S. Appl. No. 10/492,343, dated Aug. 18, 2008, 12 pages.
Office Action from U.S. Appl. No. 10/492,343, dated Dec. 22, 2008, 9 pages.
Notice of Allowance from U.S. Appl. No. 10/492,343, dated Jun. 26, 2009, 6 pages.
Office Action from U.S. Appl. No. 11/747,733, dated Mar. 16, 2009, 9 pages.
Office Action from U.S. Appl. No. 11/747,733, dated Mar. 23, 2010, 5 pages.
Notice of Allowance from U.S. Appl. No. 11/747,733, dated Sep. 29, 2010, 8 pages.
Notice of Allowance from U.S. Appl. No. 12/293,193, dated Oct. 8, 2009, 10 pages.
Expert Report of Marcus Weldon, Ph.D. dated Nov. 1, 2000.
Expert Report of Jean-Pierre Colinge dated Nov. 1, 2000.
Expert Report of Chris Van de Walle, Ph.D. dated Nov. 1, 2000.
Memorandum in Support of Defendant Silicon Genesis Corporation's Motion for Summary Judgment of Invalidity for Lack of Enablement dated Mar. 19, 2001.
Memorandum of Points and Authorities in Support of Soitec's Motion for Summary Judgment on Sigen's Enablement Invalidity Claim (Redacted) dated Mar. 27, 2001.
Soitec's Memorandum of Points and Authorities in Opposition to Silicon Genesis Corporation's Motion for Summary Judgment of Invalidity for Lack of Enablement dated Apr. 11, 2001.
Memorandum in Support of Defendant Silicon Genesis Corporation's Opposition to Soitec's Motion for Summary Judgment on SiGen's Defense of Enablement dated Apr. 20, 2001.
Reply Memorandum in Support of Defendant Silicon Genesis Corporation's Motion for Summary Judgment of Invalidity for Lack of Enablement dated Apr. 30, 2001.
Expert Report of Marcus Weldon, Ph.D. dated Aug. 24, 2001.
Report of Jean-Pierre Colinge in Response to SiGen Enablement and Indefiniteness Expert Reports of Aug. 24, 2001.
Expert Report of Chris Van de Walle, Ph.D. dated Aug. 24, 2001.
Memorandum and Order re: Summary Judgment [denied] dated Feb. 5, 2002.
Plaintiff's Memorandum in Support of Their Motion for Judgment As a Matter of Law and a New Trial dated May 10, 2002.
Silicon Genesis Corporation's Opposition to Plaintiff's Motion for Judgment as a Matter of Law and a New Trial dated Jun. 17, 2002.
Memorandum of Law in Support of Plaintiff's Motion for Judgment on SiGen's Indefiniteness Defense dated Jun. 20, 2002.
Plaintiff's Reply Memorandum in Support of Their Motion for Judgment as a Matter of Law and a New Trial dated Jul. 18, 2002.
Defendant Silicon Genesis Corporation's Opposition to Soitec's Motion for Judgment Re Indefiniteness and Cross-Motion for Judgment of Indefiniteness dated Jul. 19, 2002.
Plaintiff's Reply in Support of their Motion for Judgment on SiGen's Indefiniteness Defense dated Jul. 25, 2002.
Memorandum and Order re: Post-Trial Motions dated Aug. 23, 2002.
Judgment dated Oct. 21, 2002.
Brief of Plaintiffs-Appellants Soitec, S.A. And Commissariat a L'Energie Atomique dated Jan. 28, 2003.
Brief for Defendant-Cross Appellant Silicon Genesis Corporation dated Mar. 22, 2003.
Reply Brief of Plaintiffs-Appellants Soitec, S.A. And Commissariat a L'Energie Atomique dated May 5, 2003.
Reply Brief for Defendant-Cross Appellant Silicon Genesis Corporation dated May 19, 2003.
Plaintiff/Appellants Supplemental Authority Letter [dated Nov. 17, 2003].
Defendant-Cross Appellant's Response to Appellants' Submission of *CFMT, Inc.* v. *Yieldup Int'l*, [dated Nov. 24, 2003].
Decision from the United States Court of Appeals for the Federal Circuit dated Nov. 26, 2003.
Combined Petition for Panel Rehearing and for Rehearing En Banc by Plaintiffs-Appellant's Soitec, S.A. and Commissariat a L'Energie Atomique, dated Dec. 10, 2003.
Order [dated Jan. 7, 2004 denying Appellants' petition for panel rehearing and Appellant's petition for rehearing en banc].
Judgment Mandate [dated Jan. 14, 2004].
Notice of by SOITEC Silicon on Insulator Technologies SA, Commissariat a L'Energie Atomique re 30 Motion to Dismiss Based upon Fed. R. Civ. P. 12(b)(1) and (6) and Article III of the United States Constitution MOTION to Dismiss Based upon Fed. R. Civ. P. 12(b)(1) and (6) and Article III of the United States Constitution Notice of Withdrawal of Plaintiffs' Partial Motion to Dismiss Counterclaim Counts II, III, IV, V, and VIII (Attachments: # 1 Certificate of Service)(Kraft, Denise) (Entered: Jul. 2, 2009).
Stipulation and [Proposed] Order to File an Amended Complaint by SOITEC Silicon on Insulator Technologies SA, Commissariat a LEnergie Atomique. (Attachments: # 1 Exhibit A, # 2 Certificate of Service)(Kraft, Denise) (Entered: Jul. 16, 2009).
Notice of Service of Soitec's Objections and Responses to MEMC's Second Request for Production of Documents and Things Directed to Soitec re 46 Notice of Service by SOITEC Silicon on Insulator Technologies SA, Commissariat a LEnergie Atomique. Related document: 46 Notice of Service filed by MEMC Electronic Materials Inc. (Attachments: # 1 Certificate of Service)(Kraft, Denise) (Entered: Jul. 16, 2009).
First Amended Complaint for Patent Infringement against Memc Electronic Materials Inc.- filed by Soitec Silicon on Insulator Technologies Sa, Commissariat a L'Energie Atomique. (Attachments: # 1 Exhibit Exhibit 1, # 2 Exhibit Exhibit 2, # 3 Exhibit Exhibit 3, # 4 Exhibit Exhibit 4, # 5 Certificate of Service)(Kraft, Denise) (Entered: Jul. 21, 2009).
Answer to Amended Complaint Answer to 57 Amended Complaint, with Under Federal Rule of Civil Procedure 38, MEMC demands a trial by jury on all issues so triable., COUNTERCLAIM against all plaintiffs by MEMC Electronic Materials Inc.. (Attachments: # 1 Exhibit A, # 2 Certificate of Service)(Rogowski, Patricia) (Entered: Aug. 3, 2009).
Answer to 60 Answer to Amended Complaint, Counterclaim,,, COUNTERCLAIM Reply to Defendant's Amended Counterclaims, Counterclaims and Affirmative Defenses against MEMC Electronic Materials Inc. By SOITEC Silicon on Insulator Technologies SA, Commissariat a L'Energie Atomique, SOITEC U.S.A., Inc.. (Attachments: # 1 Certificate of Service)(Kraft, Denise) (Entered: Aug. 31, 2009).
Notice of Service of MEMC's Third Set of Interrogatories Directed to S.O.I.Tec Silicon on Insulator Technologies, S.A., Soitec USA, Inc., and Commissariat a L'Energie Atomique by MEMC Electronic Materials Inc. (Rogowski, Patricia) (Entered: Sep. 1, 2009).

Answer to 68 Answer to Counterclaim,,, by MEMC Electronic Materials Inc..(Rogowski, Patricia) (Entered: Sep. 14, 2009). Minute Entry for proceedings held before Judge Sue L. Robinson—Discovery Conference held on Sep. 16, 2009. (Court Reporter V. Gunning.) (nmf) (Entered: Sep. 16, 2009).
Motion to Bifurcate the Issues of Willfulness and Damages for Purposes of Discovery and Trial and proposed Form of Order—filed by MEMC Electronic Materials Inc.. (Rogowski, Patricia) (Entered: Oct. 20, 2009). Correcting Entry: Docket clerk deleted D.I. 78 (opening brief) due to document being filed improperly. Counsel is advised to re-file document using the OPENING BRIEF event code rather than the combined opening and answering brief event code. (lid) (Entered: Oct. 21, 2009).
Opening Brief in Support re 77 MOTION to Bifurcate the Issues of Willfulness and Damages for Purposes of Discovery and Trial and proposed Form of Order filed by MEMC Electronic Materials Inc.. Answering Brief/Response due date per Local Rules is Nov. 9, 2009. (Attachments: # 1 Exhibit A, # 2 Exhibit B, # 3 Exhibit C)(Rogowski, Patricia) (Entered: Oct. 21, 2009).
Cross Motion to Bifurcate all Collateral Issues—filed by SOITEC Silicon on Insulator Technologies SA, SOITEC U.S.A., Inc., Commissariat a LEnergie Atomique. (Attachments: # 1 Text of Proposed Order, # 2 Certificate of Service)(Kraft, Denise) (Entered: Nov. 9, 2009).
Answering Brief in Opposition re 85 Cross MOTION to Bifurcate all Collateral Issues, 77 MOTION to Bifurcate the Issues of Willfulness and Damages for Purposes of Discovery and Trial and proposed Form of Order filed by SOITEC Silicon on Insulator Technologies SA, Commissariat a LEnergie Atomique.Reply Brief due date per Local Rules is Nov. 20, 2009. (Attachments: # 1 Exhibit, # 2 Exhibit, # 3 Exhibit, # 4 Exhibit, # 5 Exhibit, # 6 Exhibit, # 7 Exhibit, # 8 Exhibit, # 9 Exhibit, # 10 Exhibit, # 11 Exhibit, # 12 Declaration, # 13 Certificate of Service)(Kraft, Denise) (Entered: Nov. 9, 2009).
Reply Brief re 77 MOTION to Bifurcate the Issues of Willfulness and Damages for Purposes of Discovery and Trial and proposed Form of Order filed by MEMC Electronic Materials Inc.. (Attachments: # 1 Exhibit 1, # 2 Exhibit 2, # 3 Exhibit 3)(Rogowski, Patricia) (Entered: Nov. 17, 2009).
Answering Brief in Opposition re 85 Cross MOTION to Bifurcate all Collateral Issues filed by MEMC Electronic Materials Inc..Reply Brief due date per Local Rules is Dec. 3, 2009. (Rogowski, Patricia) (Entered: Nov. 19, 2009).
Reply Brief re 85 Cross Motion to Bifurcate all Collateral Issues filed by Commissariat a LEnergie Atomique, SOITEC Silicon on Insulator Technologies Sa, Soitec U.S.A., Inc.. (Attachments: # 1 Exhibit Declaration of Marcus T. Hall in Support of Plaintiffs' Reply Re: Cross-Motion to Bifurcate all Collateral Issues)(Kraft, Denise) (Entered: Dec. 3, 2009).
Notice of Service of S.O.I.TEC Silicon on Insulator Technologies, S.A. And Commissariat a L'Energie Atomique's Production of Three Boxes of Wafer Samples by Commissariat a LEnergie Atomique, SOITEC Silicon on Insulator Technologies SA, SOITEC U.S.A., Inc.. (Attachments: # 1 Certificate of Service)(Kraft, Denise) (Entered: Dec. 08, 2009). Set Hearings: Discovery Conference set for Dec. 21, 2009 04:00 PM in Courtroom 6B before Judge Sue L. Robinson. (nmf) (Entered: Dec. 9, 2009).
Motionfor Leave to File Stipulated Motion for Leave to File a Sur-Reply Brief in Support of MEMC's Motion to Bifurcate—filed by MEMC Electronic Materials Inc.. (Attachments: # 1 Exhibit 1)(Rogowski, Patricia) (Entered: Dec. 14, 2009).
Sur-Reply Brief re 77 Motion to Bifurcate the Issues of Willfulness and Damages for Purposes of Discovery and Trial and proposed Form of Order MEMC's Sur-Reply Brief in Support of Its Motion to Bifurcate the Issues of Willfulness and Damages for Purposes of Discovery and Trial filed by MEMC Electronic Materials Inc.. (Rogowski, Patricia) (Entered: Dec. 16, 2009).
Motion for Discovery Motion for the Admission of the Expert Testimony of John T. Goolkasian Relating to the Certificate of Correction for U.S. Patent No. 7,067,396—filed by Memc Electronic Materials Inc.. (Rogowski, Patricia) (Entered: May 7, 2010).
Opening Brief in Support re 141 MOTION for Discovery MOTION for the Admission of the Expert Testimony of John T. Goolkasian Relating to the Certificate of Correction for U.S. Patent No. 7,067,396 filed by MEMC Electronic Materials Inc..Answering Brief/Response due date per Local Rules is May 24, 2010. (Attachment: 190 1 Exhibit 1, # 2 Exhibit2, # 3 Exhibit 3, # 4 Exhibit 4, # 5 Exhibit 5, # 6 Exhibit 6, # 7 Exhibit 7, # 8 Exhibit 8, # 9 Exhibit 9, # 10 Exhibit 10, # 11 Exhibit 11, # 12 Exhibit 12, # 13 Exhibit 13, # 14 Exhibit 14, # 15 Exhibit 15)(Rogowski, Patrica) (Entered: MAy 7, 2010).
Answering Brief in Opposition re 141 Motion for Discovery Motion for the Admission of the Expert Testimony of John T. Goolkasian Relating to the Certificate of Correction for U.S. Patent No. 7,067,396 Plaintiff's Answering Brief in Opposition to Defendant's Motion for the Admission of Expert Testimony of John T. Goolkasian filed by SOITEC Silicon on Insulator Technologies SA.Reply Brief due date per Local Rules is Jun. 4, 2010. (Attachments: # 1 Certificate of Service)(Kraft, Denise) (Entered: May 24, 2010).
Declaration re 145 Answering Brief in Opposition,, Declaration of Marcus T. Hall in Support Plaintiff's Answering Brief in Opposition to Defendant's Motion for the Admission of Expert Testimony of John T. Goolkasian by SOITEC Silicon on Insulator Technologies SA. (Attachments: # 1 Exhibit A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Certificate of (Entered: May 24, 2010).
Replu Brief in Support of 141 Motion for Discovery Motion for the Admission of the Expert Testimony of John T. Goolkasian Relating to the Certificate of Correction for U.S. Patent No. 7,067,396 filed by MEMC Electronic Materials Inc.. (Attachments: # 1 Exhibit 1, # 2 Exhibit 2, # 3 Exhibit 3, # 4 Exhibit 4, # 5 Exhibit 5, # 6 Exhibit 6)(Rogowski, Patricia) Modified on Jun. 4, 2010 (lid). (Entered Jun. 4, 2010).
Statement re 148 Stipulation Joint Claim Construction Statement by Commissariat a LEergie Atomique, SOITEC Silicon on Insulator Technologies SA, SOITEC U.S.A., Inc.. (Attachment: # 1 Certificate of Service)(Kraft, Denise) (Entered: Jun. 14, 2010).
Claim Construction Chart by Commissariat a LEnergie Atomique, SOITEC Silicon on Insulator Technologies SA, SOITEC U.S.A., Inc.. (Attachments: # 1 Certificate of Service)(Kraft, Denise) (Entered: Jun. 14, 2010).
Sur-Relp Brief re 141 MOTION for Discovery Motion for the Admission of the Expert Testimony of John T. Goolkasian Relating to the Certificate of Correction for U.S. Patent No. 7,067,396 Surreply by Plaintiffs to Motion by Defendant for the Admission of Expert Testimony SA. (Attachments: # 1 Certificate of Service)(Kraft, Denise) (Entered: Jun. 15, 2010).
Declaration re 157 Sur-Reply Brief, Declaration of Marcus T. Hall in Support of Surreply by Plaintiffs to Motion by Defendant for the Admission of Expert Testimony of John T. Goolkasian by SOITEC Silicon on Insulator Technologies SA. (Attachments: # 1 Exhibit A, # 2 Exhibit B, # 3 Exhibit C, # 4 Exhibit D, # 5 Certificate of Service)(Kraft, Denise) (Entered: Jun. 15, 2010).
Claim Construction Opening Brief filed by MEMC Electronic Materials Inc.. (Attachments: # 1 Appendix DA0001-DA0006, # 2 Appendix DA0007-DA0032, # 3 Appendix DA0033-DA0072, # 4 Appendix DA0073-DA0112, # 5 Appendix DA0113- DA0152, # 6 Appendix DA0153-DA0192, # 7 Appendix DA0193-DA0232, # 8 Appendix DA0233-DA0272, # 9 Appendix DA0273-DA0312, # 10 Appendix DA0313- DA0352, # 11 Appendix DA0353-DA0392, # 12 Appendix DA0393-DA0432, # 13 Appendix DA0433-DA0472, # 14 Appendix DA0473-DA0512, # 15 Appendix DA0513- DA0521, # 16 Appendix DA0522-DA0545, # 17 Appendix Sealed - DA0546-DA0551, # 18 Appendix DA0552-DA0563, # 19 Appendix Sealed - DA0564- DA0566, # 20 Appendix DA0567-DA0573, # 21 Appendix Sealed - DA0574- DA0599, # 22 Appendix DA0600-DA0604, # 23 Appendix DA0605-DA0609, # 24 Appendix DA0610-DA0625, # 25 Appendix DA0626-0634, # 26 Appendix DA0635, # 27 Appendix DA0636-DA0652, # 28 Appendix Sealed - DA0653-DA0657, # 29 Appendix DA0658-DA0667, # 30 Appendix DA0668-DA0670, # 31 Appendix DA0671- DA0678, # 32 Appendix DA0679-DA0687, # 33 Appendix DA0688-DA0696, # 34 Appendix Sealed - DA0697-DA0705, # 35 Appendix Sealed - DA0706-DA0711, # 36 Appendix Sealed - DA0712-DA0714, # 37 Appendix DA0715-DA0717, # 38 Appendix DA0718-DA0719, # 39 Appendix DA0720-DA0722, # 40

Appendix DA0723- DA0732, # 41 Appendix DA0733-DA0740, # 42 Appendix DA0741-DA0749, # 43 Appendix DA0750-DA0769, # 44 Appendix DA0770-DA0781)(Rogowski, Patricia) (Entered: Jun. 25, 2010).
Claim Construction Opening Brief Plaintiffs S.O.I.Tec Silicon on Insulator Technologies, S.A. And Commissariat a L'Energie Atomique's Opening Claim Construction Brief filed by Commissariat a LEnergie Atomique, SOITEC Silicon on Insulator Technologies SA. (Attachments: # 1 Certificate of Service)(Kraft, Denise) (Entered: Jun. 25, 2010).
Declaration re 168 Claim Construction Opening Brief, Declaration of Marcus T. Hall in Support of Plaintiffs S.O.I.TEC Silicon on Insulator Technologies, S.A. and Commissariat a L'Energie Atomique's Opening Claim Construction Brief by Atomique, SOITEC Silicon on Insulator Technologies SA. (Attachments: # 1 Certificate of Service)(Kraft, Denise) (Entered: Jun. 25, 2010).
Appendix re 167 Claim Construction Opening Brief,,,,,, by MEMC Electronic Materials Inc.. (Attachments: # 1 Appendix DA-0001—DA-0006, # 2 Appendix DA-0007—DA-0032, # 3 Appendix DA-0033—DA-0072, # 4 Appendix DA-0073—DA-0112, # 5 Appendix DA-0113—DA-0152, # 6 Appendix DA-0153—DA-0192, # 7 Appendix DA-0193—DA-0232, # 8 Appendix DA-0233—DA-0272, # 9 Appendix DA-0273—DA-0312, # 10 Appendix DA-0313—DA-0352, # 11 Appendix DA-0353—DA-0392, # 12 Appendix DA-0393—DA-0432, # 13 Appendix DA-0433—DA-0472, # 14 Appendix DA-0473—DA-0512, # 15 Appendix DA-0513—DA-0521)(Rogowski, Patricia) (Entered: Jun. 28, 2010).
Redacted Version of 175 Appendix by MEMC Electronic Materials Inc.. (Attachments: # 1 Appendix DA0522-DA0545, # 2 Appendix DA0546-DA0551, # 3 Appendix DA0552-DA0563, # 4 Appendix DA0566, # 5 Appendix DA0567-DA0573, # 6 Appendix DA0574-DA0599, # 7 Appendix DA0600-DA0604, # 8 Appendix DA0605-DA0609, # 9 Appendix DA0610-DA0625, # 10 Appendix DA0626-DA0634, # 11 Appendix DA0635, # 12 Appendix DA0636-DA0652, # 13 Appendix DA0653-DA0657, # Appendix DA0658-DA0667, # 15 Appendix DA0668-DA0670, # 16 Appendix DA0671-DA0678, # 17 Appendix DA0679-DA0687, # 18 Appendix DA0688-DA0696, # 19 Appendix DA0697-DA0705, # 20 Appendix DA0706-DA-0711, # 21 Appendix DA0712-DA0714, # 22 Appendix DA0715-DA0717, # 23 Appendix DA0718-DA0719, # 24 Appendix DA0720-DA0722, # 25 Appendix DA0723-DA0732, # 26 Appendix DA0733-DA0740, # 27 Appendix DA0741-DA0749, # 28 Appendix DA0750-DA0769, # 29 Appendix DA0770-DA0781, # 30 Certificate of Service)(Rogowski, Patricia) (Entered: May 28, 2010).
Notice of filing the following document(s) in paper format: Joint Appendix of Exhibits to Opening and Answering Claim Construction Briefs (1) vol. I-JA0001 to JA0533. Appendix vol. I re 173 Notice of Filing Paper Documents(Oversized Document, Item on File in the Clerks Office). (lid) (Entered: Jun. 28, 2010).
Notice of filing the following document(s) in paper format: Joint Appendix of Exhibits to Opening and Answering Claim Construction Briefs (2) vol. II re 173 Notice of Filing Paper Documents(Oversized Document, Item on File in the Clerks Office). (lid) (Entered: Jun. 28, 2010).
Notice of filing the following document(s) in paper format: Joint Appendix of Exhibits to Opening and Answering Claim Construction Briefs (3) vol. III—JA0931 to JA1502. Appendix vol. III. re 173 Notice of Filing Paper Documents(Oversized Document, Item on File in the Clerks Office) (lid) (Entered: Jun. 28, 2010) (2 parts).
Notice of filing the following document(s)in paper format: Joint Appendix of Exhibits to Opening and Answering Claim Construction Briefs (4) vol. IV. re 173 Notice of Filing Papers Documents, (Oversized Document, Item on File in the Clerks Office) (lid) (Entered: Jun. 28, 2010).
Notice of filing the following document(s) in paper format: Joint Appendix of Exhibits to Opening and Answering Claim Construction Briefs (5) vol. V—JA1511 to JA2089 (2 parts).
Vol. VI—JA2090 to JA2557. Original document(s) to be filed with the Clerk's Office. Notice filed by Denise Seastone Kraft on behalf of Commissariat a LEnergie Atomique, SOITEC Silicon on Insulator Technologies SA (Attachments: # 1 Certificate of Service)(Kraft, Denise) (Entered: Jun. 25, 2010).

Motion in Limine SOITEC/CEA Parties' Motion to Exclude the Expert Report of Dr. Pascal Belton and Any Related Testimony—filed by Commissariat a LEnergie Atomique, SOITEC Silicon on Insulator Technologies SA. (Attachments: # 1 Text of Proposed Order, # 2 Certificate of Service)(Kraft, Denise) (Entered: Jul. 2, 2010).
Motion for Partial Summary Judgment of Invalidity of the Asserted Aspar Patent Claims—filed by MEMC Electronic Materials Inc.. (Attachments: # 1 Text of Proposed Order, # 2 Certificate of Service)(Rogowski, Patricia) (Entered: Jul. 2, 2010).
Opening Brief in Support re 186 re 186 MOTION in Limine SOITEC/CEA Parties' Motion to Exclude the Expert Report of Dr. Pascal Bellon and Any Related Testimony filed by Commissariat a LEnergie Atomique, SOITEC On Insulator Technologies SA.Answering Brief/Response due date per Local Rules is Jul. 19, 2010. (Attachments: # 1 Certificate of Service)(Kraft, Denise) (Entered: Jul. 2, 2010).
Opening Brief in Support re 187 Motion for Partial Summary Judgement of Invalidity of the Asserted Aspar Patent Claims filed by MEMC Electronic Materials Inc..Answering Brief/Response due date per Local Rules is Jul. 19, 2010. (Rogowski, Patricia) (Entered: Jul. 2, 2010).
Appendix re 186 MOTION in Limine SOITEC/CEA Parties' Motion to Exclude the Expert Report of Dr. Pascal Belton and any Related Testimony Plaintiffs' Omnibus Appendix to Daubert Motion and Motions for Partial Summary Judgment Filed on Jul. 2, 2010 by Commissariat a LEnergie Atomique, SOITEC Silicon on Insulator Technologies SA. (Attachments: # 1 Appendix vol. II of XIX, # 2 Appendix vol. III of XIX, # 3 Appendix vol. IV of XIX, # 4 Appendix vol. V of XIX, # 5 Appendix vol. VII of XIX, # 6 Appendix vol. IX of XIX, # 7 Appendix vol. XI of XIX, # 8 Appendix vol. XII of XIX, # 9 Appendix vol. XIII of XIX, # 10 Appendix vol. XIV of XIX, # 11 Appendix vol. XV of XIX, # 12 Appendix vol. XVI of XIX, # 13 Appendix vol. XVIII of XIX, # 14 Certificate of Service)(Kraft, Denise) (Entered: Jul. 2, 2010).
Motion for Summary Judgment of Non-Infringement - filed by MEMC Electronic Materials Inc.. (Attachments: # 1 Text of Proposed Order, # 2 Certificate of Service)(Rogowski, Patricia) (Entered: Jul. 2, 2010).
Motion for Partial Summary Judgment SOITEC/CEA Parties Motion for Partial Summary Judgment That the Patents in Suit Satisfy the Written Description Requirement—filed by Commissariat a LEnergie Atomique, SOITEC Silicon on Insulator Technologies SA. (Attachments: # 1 Certificate of Service)(Kraft, Denise) (Entered: Jul. 2, 2010).
Opening Brief in Support re 202 MOTION for Partial Summary Judgment SOITEC/CEA Parties Motion for Partial Summary Judgment that the Patents in Suit Satisfy the Writtem Description Requirement filed by Commissariat a LEnergie Atomique, SOITEC Silicon On Insulator Technologies SA, SOITEC U.S.A., Inc..Answering Brief/Response due date per Local Rules is Jul. 19, 2010. (Attachments: # Certificate of Service)(Kraft, Denise) (Entered: Jul. 2, 2010).
Motion for Partial Summary Judgment Plaintiffs' Motion for Partial Summary Judgment That the Certificate of Correction for the '396 Patent is Valid—filed by Commissariat a LEnergie Atomique, SOITEC Silicon on Insulator Technologies SA. (Attachments: # 1 Certificate of Service)(Kraft, Denise) (Entered: Jul. 2, 2010).
Opening Brief in Support re 204 Motion for Partial Summary Judgment Plaintiffs' Motion for Partial Summary Judgment That the Certificate of Correction for the '396 Patent is Valid filed by Commissariat a LEnergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 2, 2010).
MOTION for Partial Summary Judgment SOITEC/CEA Parties' Motion for Partial Summary Judgment That the Aspar Patents Are Not Invalid for Inequitable Conduct -filed by Commissariat a LEnergie Atomique, SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).
Opening Brief in Support re 206 MOTION for Partial Summary Judgment SOITEC/CEA Parties' Motion for Partial Summary Judgment That the Aspar Patents Are Not Invalid for Inequitable Conduct filed by Commissariat a LEnergie Atomique, SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).

Motion for Partial Summary Judgment Plaintiffs' Motion for Partial Summary Judgment That the Bruel Patent Does Not Anticipate the Aspar Patents—filed by Commissariat a LEnergie Atomique, SOITEC Silicon on Insulator Technologies SA. (Attachments: # 1 Text of Proposed Order, # 2 Certificate of Service)(Kraft, Denise) (Entered: Jul. 2, 2010).

Opening Brief in Support re 208 MOTION for Partial Summary Judgment Plaintiffs' Motion for Partial Summary Judgment That the Bruel Patent Does Not Anticipate the Aspar Patents filed by Commissariat a LEnergie Atomique, SOITEC Silicon on Insulator Technologies SA.Answering Brief/Response due date per Local Rules is Jul. 19, 2010. (Attachments: # 1 Certificate of Service)(Kraft, Denise) (Entered: Jul. 2, 2010).

Motion for Partial Summary Judgment SOITEC's Motion for Partial Summary Judgment of Invalidity of United States Patent No. 5,834,812 for Lack of Enablement - filed by SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).

Opening Brief in Support re 210 MOTION for Partial Summary Judgment Soitec's Motion for Partial Summary Judgment of Invalidity of United States Patent No. 5,834,812 for Lack of Enablement filed by SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).

Motion for Partial Summary Judgment SOITEC's Motion for Partial Summary Judgment for Invalidity of Asserted Claims of United States Patent No. 5,834,812 in View of Prior Art—filed by SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).

Motion for Partial Summary Judgment That the Best Mode Requirement is Satisfied for the Claims of the '009 and '396 Patents—filed by Commissariat a LEnergie Atomique, SOITEC Silicon on Insulator Technologies SA. (Attachments: # 1 Text of Proposed Order, # 2 Certificate of Service)(Reed, John) (Entered: Jul. 2, 2010).

Opening Brief in Supportre 212 MOTION for Partial Judgment SOITEC's Motion for Partial Summary Judgment for Invalidity of Asserted Claims of United States Patent No. 5,834,812 in View of Prior Art filed by SOITEC Silicon On Insulator Technologies SA, SOITEC U.S.A., Inc..Answering Brief/Response due date per Local Rules is Jul. 19, 2010. (Attachments: # 1 Certificate of Service)(Kraft, Denise)(Entered: Jul. 2, 2010).

Opening Brief in Support re 213 MOTION for Partial Summary Judgment That the Best Mode Requirement is Satisfied for the Claims of the '009 and '396 Patents filed by SOITEC Silicon on Insulator Technologies SA.Answering Brief/Response due date per Local Rules is Jul. 19, 2010. (Attachments: # 1 Certificate of Service)(Reed, John) (Entered: Jul. 2, 2010).

Redacted Versio re 200 Opening Brief in Support, by MEMC Electronic Materials Inc.. (Attachment: # Certificate of Service)(Rogowski, Patricia) (Entered: Jul. 7, 2010).

Redacted Version of 201 Appendix by MEMC Electronic Materials Inc.. (Attachments: # 1 Appendix MA0001—MA0004, # 2 Appendix MA0005—MA0010, # 3 Appendix MA0011—MA0016, # 4 Appendix MA0017—MA0020, # 5 Appendix MA0021—MA0029, # 6 Appendix MA0030—MA0045, # 7 Appendix MA0046—MA0052, # 8 Appendix MA0053—MA0078, # 9 Appendix MA0079—MA0092, # 10 Appendix MA0093—MA0129, # 11 Appendix MA0130—MA0148, # 12 Appendix MA0149—MA0160, # 13 Appendix MA0161—MA0163, # 14 Appendix MA0164—MA0167, # 11 5 Appendix MA0168—MA0172, # 16 Appendix MA0173—MA0183, # 17 Appendix MA0184—MA0196, # 18 Appendix MA0197—MA0207, # 19 Appendix MA0208—MA0241, # 20 Appendix MA0242—MA0245, # 21 Appendix MA0246—MA0249, # 22 Appendix MA0250 - MA0252, # 23 Appendix MA0253—MA0265, # 24 Appendix MA0266—MA0281, # 25 Appendix MA0282—MA0312, # 26 Appendix MA0313—MA0359, # 27 Appendix MA0360—MA0365, # 28 Appendix MA0366, # 29 Appendix MA0367—MA0400, # 30 Appendix MA0401—MA0474, # 31 Appendix MA0475—MA0483, # 32 Certificate)(Rogowski, Patricia) (Entered: Jul. 7, 2010).

Redacted Version of 190 Appendix by MEMC Electronic Materials Inc.. (Attachments: # 1 Appendix MA0484—MA0489, # 2 Appendix MA0490—MA0515, # 3 Appendix MA0516—MA0534, # 4 Appendix MA0535—MA0541, # 5 Appendix MA0542—MA0550, # 6 Appendix MA0551—MA0561, # 7 Appendix MA0562—MA0564, # 8 Appendix MA0565—MA0569, # 9 Appendix MA0570—MA0574, # 10 Appendix MA0575—MA0576, # 11 Appendix MA0577—MA0601, # 12 Appendix MA0602—MA0603, # 13 Appendix MA0604—MA0605, # 14 Appendix MA0606—MA0609, # 15 Appendix MA0610—MA0612, # 16 Appendix MA0613—MA0625, # 17 Appendix MA0626—MA0628, # 18 Appendix MA0629—MA0630, # 19 Appendix MA0631—MA0653, # 20 Appendix MA0654—MA0685, # 21 Appendix MA0686—MA0701, # 22 Appendix MA0702—MA0732, # 23 Appendix MA0733—MA0742, # 24 Appendix MA0743—MA0750, # 25 Appendix MA0751—MA0766, # 26 Appendix MA0767—MA0772, # 27 Appendix MA0773—MA0780, # 28 Appendix MA0781—MA0807, # 29 Appendix MA0808—MA0824, # 30 Appendix MA0825—MA0831.1, # 31 Appendix MA0832—MA0838, # 32 Appendix MA0839—MA0844, # 33 Appendix MA0845—MA0858, # 34 Appendix MA0859—MA0868, # 35 Appendix MA0869—MA0877, # 36 Appendix MA0878—MA0884, # 37 Appendix MA0885—MA0887, # 38 Appendix MA0888—MA0891, # 39 Appendix MA0892—MA0909, # 40 Appendix MA0910—MA0931, # 41 Certificate of Service)(Rogowski, Patricia) (Entered: Jul. 7, 2010).

Redacted Version of 198 Opening Brief in Support SOITEC/CEA Parties' Opening Brief in Support of Motion for Summary Judgment: Non-Infringement by Commissariat a LEnergie Atomique, SOITEC Silicon on Insulator Technologies SA, Soitec U.S.A., Inc.. (Kraft, Denise) (Entered: Jul. 8, 2010).

Redacted Version of 197 Sealed Motion for Summary Judgment Soitec/Cea Parties' Motion for Summary Judgment: Non-Infringement (Filed Under Seal)Sealed Motion for Summary Judgment Soitec/Cea Parties' Motion for Summary Judgment: Non-Infringement (Filed Under Seal) SOITEC/CEA Parties' Motion for Summary Judgment: Non-Infringement by Commissariat a LEnergie Atomique, Soitec Silicon on Insulator Technologies SA, SOITEC U.S.A., Inc.. (Kraft, Denise) (Entered: Jul. 8, 2010).

Redacted Version of 192 Appendix, Plaintiffs' Omnibus Appendix to Dauber Motion and Motions for Partial Summary Judgment Filed on Jul. 2, 2010—vol. VI of XIX by Commissariat a LEnergie Atomique, SOITEC Silicon on Insulator Technologies SA, SOITEC U.S.A., Inc.. (Kraft, Denise) (Entered: Jul. 9, 2010).

Redacted Version of 193 Appendix, Plaintiffs' Omnibus Appendix to Daubert Motion and Motions for Partial Summary Judgment Filed on Jul. 2, 2010—vol. VIII of XIX by Commissariat a LEnergie Atomique, SOITEC Silicon on Insulator Technologies SA, Soitec U.S.A., Inc.. (Kraft, Denise) (Entered: Jul. 9, 2010).

Redacted Version of 194 Appendix, Plaintiffs' Omnibus Appendix to Daubert Motion and Motions for Partial Summary Judgment Filed on Jul. 2, 2010—vol. X of XIX by Commissariat a LEnergie Atomique, SOITEC Silicon on Insulator Technologies SA, Soitec U.S.A., Inc.. (Kraft, Denise) (Entered: Jul. 9, 2010).

Redacted Version of 195 Appendix Plaintiff's Omnibus Appendix to Daubert Motion and Motion for Partial Summary Judgment Filed on Jul. 2, 2010—vol. XVII of XIX by Commissariat a LEnergie Atomique, SOITEC Silicon ON Insulator Technologies SA, SOITEC U.S.A., Inc.. (Kraft, Denise) (Entered: Jul. 9, 2010).

Redacted Version Motion of 196 Appendix, Plaintiffs' Omnibus Appendix to Daubert Motion and Motions for Partial Summary Judgment Filed on Jul. 2, 2010—vol. X of XIX by Commissariat a LEnergie Atomique, SOITEC Silicon on Insulator Technologies SA, Soitec U.S.A., Inc.. (Kraft, Denise) (Entered: Jul. 9, 2010).

Claim Construction Answering Brief re 168 Claim Construction Opening Brief, filed by Memc Electronic Materials Inc.. (Attachments: # 1 Certificate of Service)(Rogowski, Patricia) (Entered: Jul. 9, 2010).

Appendix re 228 Claim Construction Answering Brief by MEMC Electronic Materials Inc.. (Attachment: # Appendix DA0782 DA0783, # 2 Appendix DA0784—DA0785, # 3 Appendic DA0786 # 4 Appendix DA0787—DA0810, # 5 Appendix DA0811—DA0834 # 6 DA0835—DA0845, # 7 Appendix DA0846—DA0855, # 8 Certificate of Service)(Rogowski, Patricia) (Entered: Jul. 9, 2010).

Claim Construction Answering Brief re 168 Claim Construction Opening Brief, 228 Claim Construction Answering Brief Plaintiffs S.O.I.Tec on Insulator Technologies, S.A. And Commissariat a Energie Atomique's Answering Claim Construction Brief filed by Commissariat a LEnergie Atomique, SOITEC Silicon on Insulator Technologies SA, SOITEC U.S.A., Inc.. (Attachments: # 1 Certificate of Service)(Kraft, Denise) (Entered: Jul. 9, 2010).

Appendix re 230 Claim Construction Answering Brief, Appendix to Plaintiffs S.O.I.TEC on Insulator Technologies, S.A. And Commissariat a Energie Atomique's Answering Claim Construction Brief by Commissariat a LEnergie Atomique, SOITEC Silicon on Insulator Technologies SA. (Attachments: # 1 Appendix PA-0001 - PA-0050, # 2 Appendix PA-0051—PA-0083, # 3 Certificate of Service)(Kraft, Denise) (Entered: Jul. 9, 2010).

Redacted Version of 183 Appendix, Joint Appendix of Exhibits to Opening and Answering Claim Construction Briefs vol. IV of VI by Commissariat a LEnergie Atomique, SOITEC Silicon on Insulator Technologies SA. (Kraft, Denise) (Entered: Jul. 12, 2010).

Redacted Version of 170 Exhibit to a Document, Exhibit a to Declaration of Marcus T. Hall in Support of Plaintiffs S.O.I.TEC Silicon on Insulator Technologies, S.A. And Commissariat a L'Energie Atomique's Opening Claim Construction Brief by Commissariat a LEnergie Atomique, SOITEC Silicon on Insulator Technologies SA. (Kraft, Denise) (Entered: Jul. 12, 2010).

Redacted Version of 171 Exhibit to a Document, Exhibit B to Declaration of Marcus T. Hall in Support of Plaintiffs S.O.I.TEC Silicon on Insulator Technologies, S.A. And Commissariat a L'Energie Atomique's Opening Claim Construction Brief by Commissariat a LEnergie Atomique, Soitec Silicon on Insulator Technologies SA. (Kraft, Denise) (Entered: Jul. 12, 2010).

Redacted Version of 172 Exhibit to a Document, Exhibit C to Declaration of Marcus T. Hall in Support of Plaintiffs S.O.I.TEC Silicon on Insulator Technologies, S.A. And Commissariat a L'Energie Atomique's Opening Claim Construction Brief by Commissariat a LEnergie Atomique, SOITEC Silicon on Insulator Technologies Sa. (Kraft, Denise) (Entered: Jul. 12, 2010).

Answering Brief in Opposition re 186 MOTION in Limine SOITEC/CEA Parties'Motion to Exclude the Expert Report of Dr. Pascal Bellon and Any Related Testimony filed by MEMC Electronic Materials Inc..Reply Brief due date per Local Rules is Jul. 29, 2010. (Rogowski, Patricia) (Entered: Jul. 19, 2010).

Answering Brief in Opposition re 208 MOTION for Partial Summary Judgment Plaintiffs' Motion for Partial Summary Judgment That the Bruel Patent Does Not Anticipate the Aspar Patents filed by MEMC Electronic Materials Inc.. Reply Brief due date per Local Rules is Jul. 29, 2010. (Rogowski, Patricia) (Entered: Jul. 19, 2010).

Answering Brief in Opposition re 202 MOTION for Partial Summary Judgment SOITEC/CEA Parties Motion for Partial Summary Judgment That the Patents in Suit Satisfy the Written Description Requirement filed by MEMC Electronic Materials Inc..Reply Brief due date per Local Rules is Jul. 29, 2010. (Rogowski, Patricia) (Entered: Jul. 19, 2010).

Answering Brief in Opposition re 204 Motion for Partial Summary Judgement Plaintiff's for Partial Summary Judgment that the Certificate of Correction for '396 Patent is Valid filed by MEMC Electronic Materials Inc.. Reply Brief due date per Local Rules is Jul. 29, 2010. (Rogowski, Patricia) (Entered Jul. 19, 2010).

Answering Brief in Opposition re 210 Motion for Partial Summary Judgement SOITEC's Motion for Partial Summary Judgment of Invalidity of United States Patent No. 5,834,812 for Lack of Enablement filed by MEMC Electronic Materials Inc..Reply Brief due date per Local Rules is Jul. 29, 2010. (Rogowski, Patricia) (Entered: Jul. 19, 2010).

Answering Brief in Opposition re 212 Motion for Partial Summary Judgement SOITEC's Motion for Parial Summary Judgment for Invalidity of Asserted Claims of United States Patent No. 5,834,812 in View of Prior Ar filed by MEMC Electronic Materials Inc..Reply Brief due date per local Rules is Jul. 29, 2010. (Rogo wski, Patricia) (Entered: Jul. 19, 2010).

Appendix re 247 Answering Brief in Opposition Appendix to Plaintiffs' Answering Motion for Partial Summary Judgment of Invalidity Claims (PA-1103—PA-1156) by Commissariat a LEnergie on Insulator Technologies Sa. (Attachments: # 1 Exhibit Under Seal, # 2 Exhibit PA-1110—PA-1118—Filed Under Seal, # 3 PA-1119—PA-1130—Filed Under Seal, # 4 Exhibit PA—1131—PA-1143—Filed Under Seal, # 5 Exhibit PA-1144—PA-1156,# 6.

Appendix re 250 Answering Brief in Opposition, Appendix to Plaintiffs' Answering Brief in Opposition to Defendant's Motion for Summary Judgment of Non-Infringement by Commissariat a LEnergie Atomique, SOITEC Silicon On Insulator Technologies SA. (Attachments: # 1 Exhibits PA-1190—PA-1191, # 2 Certificate of Service)(Kraft, Denise) (Entered: Jul. 19, 2010).

Redacted Version of 241 Answering Brief in Opposition, to Plaintiffs' Motion for Partial Summary Judgment that the Best Mode Requirement is Satisfied for the Claims of the '009 and '396 Patents by MEMC Electronic Materials Inc.. (Rogowski, Patricia) (Entered: Jul. 26, 2010).

Redacted Version of 249 Answering Brief in Opposition, to Plaintiffs' Motion for Summary Judgment on the Infringement of U.S. Patent No. 5,834,812 by MEMC Electronic Materials Inc.. (Rogowski, Patricia) (Entered: Jul. 26, 2010).

Redacted Version 253 Answering Brief in Opposition, to Plaintiffs' Motion for Partial Summary Judgment that the Aspar Patents Are Not Invalid for Inequitable Conduct by MEMC Electronic Material Inc.. (Rogowski, Patricia) (Entered: Jul. 26, 2010).

Redacted Version of 240 Appendix by Memc Electronic Materials Inc..(Attachments: # 1 Appendix MA0932—MA0985, # 2 Appendix MA0986—MA1039.22, # 3 Appendix MA1040—MA1144, # 4 Appendix MA1145—MA1200, # 5 Appendix MA1201—MA1265, # 6 Appendix MA1265.1—MA1338, # 7 Appendix MA1339—MA1547, # 8 Appendix MA1548—MA1627, # 9 Appendix MA1628—MA1693, # 10 Appendix MA1694—MA1953, # 11 Appendix MA1954—MA2127, # 12 Appendix MA2128—MA2206, # 13 Appendix MA2207—MA2253, # 14 Appendix MA2254—MA2273, # 15 Appendix MA2274—MA2333, # 16 Appendix MA2334—MA2337, # 17 Appendix MA2338—MA2342, # 18 Appendix MA2343—MA2346, # 19 Appendix MA2347—MA2351, # 20 Certificate of Service)(Rogowski, Patricia) (Entered: Jul. 26, 2010) (2 parts).

Redacted Version of 261 Answering Brief in Opposition, to Plaintiffs' Motion for Partial Summary Judgment that the Best Mode Requirement is Satisfied for the Claims of the '009 and '396 Patents (Corrected Version of D.I. 241) by MEMC Electronic Materials Inc.. (Rogowski, Patricia) (Entered: Jul. 26, 2010).

Redacted Version of 250 Answering Brief in Opposition, to Soitec's Brief in Opposition to Defendant's Motion for Summary Judgment of Non-Infringement by Commissariat a LEnergie Atomique, SOITEC Silicon on Insulator Technologies SA. (Attachments: # 1 Certificate of Service)(Kraft, Denise) (Entered: Jul. 26, 2010).

Redacted Version Brief of 247 Answering Brief in Opposition to Plaintiffs' Answering Brief In Opposition to Defendany's Motion for Partial Summary Judgment of In validity of the Asserted Aspar Claims by Commissariat a LEnergie Atomique, SOITEC Silicon On Insular Technologies SA. (Attachment: # Certificate of Service)(Kraft, Denise) (Entered: Jul. 26, 2010).

Redacted Version of 254 Appendix to Appendix to Plaintiffs' Answering Brief in Opposition to Defendant's Motion for Partial Summary Judgment of Invalidity of the Asserted Aspar Claims (PA-1103—PA-1143 by Commissariat a LEnergie Atomique, Soitec Silicon on Insulator Technologies SA. (Kraft, Denise) (Entered: Jul. 26, 2010).

Redacted Version of 251 Appendix to Appendix to Plaintiffs' Answering Brief in Opposition to Defendant's Motion for Summary Judgment of Non-Infringement by Commissariat a LEnergie Atomique, SOITEC Silicon on Insulator Technologies SA. (Kraft, Denise) (Entered: Jul. 26, 2010).

Reply Brief re 204 Motion for Partial Summary Judgment Plaintiffs' Motion for Partial Summary Judgment that the Certificate of Correction for the '396 Patent is Valid Reply Brief in Support of Plaintiffs' Motion for Partial Summary Judgment that The Cerificate of Correction for the '396 Patent is Valid filed by Commissariat a LEnergie Atomique, SOITEC Silicon on Insulator Technologies SA. (Attachments: # 1 Certificate of Service)(Kraft, Denise) (Entered: Jul. 30, 2010).
Declaration re 268 Reply Brief, Declaration of Marcus T. Hall in Support of Reply Motion Brief in Support of Plaintiffs' Motion for Partial Summary Judgment that the Cerificate of Correction for the '396 Patent is Valid by Commissariat a LEnergie Atomique, SOITEC Silicon On Insulator Technologies SA. (Attachments: # 1 Exhibits A, # 2 Certificate of Service)(Kraft, Denise) (Entered: Jul. 30, 2010).
Appendix re 268 Reply Brief, Omnibus Appendix to Plaintiffs' Reply Briefs in Support and Motions for Partial Summary Judgment (Pa-1192—PA 1261) by Commissariat a LEnergie Atomique, SOITEC Silicon on Insulator Technologies SA. (Attachments: # 1 Exhibit PA-1199—PA-1204, # 2 Exhibit PA-1205—# 4 Exhibit PA-1231—PA-1237, # 5 Exhibit PA-1238—PA-1257, # 7 Exhibit PA-1258—PA-1261, # 8 Denise) (Entered: Jul. 30, 2010).
Reply Brief re 210 Motion for Partial Summary Judgment SOITEC's Motion for Partial Summary Judgment of Invalidity of United States Patent No. 5,834,812 for Lack of Enablement Reply Brief in Support of SOITEC's Motion for Partial Summary Judgment of Invalidity of United States Patent No. 5,834,812 for Lack of Enablement filed by Soitec Silicon on Insulator Technologies SA, SOITEC U.S.A., Inc.. (Attachments: # 1 Certificate of Service)(Kraft, Denise) (Entered: Jul. 30, 2010).
Reply Brief re 212 MOTION for Partial Summary Judgment SOITEC's Motion for Partial Summary Judgment for Invalidity of Asserted Claims of United States Patent No. 5,834,812 in View of Prior Art Reply Brief in Support of SOITEC's Motion for Partial Summary Judgment for Invalidity of Asserted Claims of United States Patent No. 5,834,812 in View of Prior Art filed by Soitec Silicon on Insulator Technologies Sa, Soitec U.S.A., Inc.. (Attachments: # 1 Exhibit A, # 2 Exhibit B, # 3 Certificate of Service)(Kraft, Denise) (Entered: Jul. 30, 2010).
Reply Brief re 202 MOTION for Partial Summary Judgment SOITEC/CEA Parties Judgment That the Patents in Suit Satisfy the Written Description Requirement Reply Brief in Support of SOITEC/CEA Parties's Motion for Partial Summary Judgment that the Patents in Suit Satisfy the Written Description Requirement filed by Commissariat a LEnergie Atomique, SOITEC Silicon On Insulator Technologies SA. (Attachment: # 1 Certificate of Service)(Kraft, Denise) (Entered: Jul. 30, 2010).
Redated Version of 269 Appendix, to Reply Brief in Support of MEMC's Motion for Partial Summary Judgment of Invalidity of the Asserted Aspar Patent Claims by MEMC Electronic Materials Inc.. (Attachments: # 1 Appendix Table of Contents, # 2 Appendix MA2453_MA2479, # 3 Certificate of Service)(Rogowski, Patricia) (Entered: Aug. 3, 2010).
RRedacted Version of 273 Appendix Reply Brief in Support of MEMC's of Non-Infringement by Memc # 1 Appendix Table of Contents, # 2 Appendix MA2352-MA2361, # 3 Appendix MA2362-MA2371, # 4 Appendix MA2372—# 6 Appendix MA2392—MA2399, # 7 Appendix MA2400—MA2404, # 8 MA2405—MA2422, # 9 Appendix MA2423—Appendix MA2425, # 10 Appendix MA2426—MA2427, # 11 Appendix MA2428—MA2430, # 12 Appendix MA2431—MA2440, # 13 Appendix MA2441—MA2448, # 14 Appendix MA2449—MA2452, # 15 Appendix MA2452.1—MA2452.9, # 16 Certificate of Service)(Rogowski, Patricia) (Entered: Aug. 3, 2010).
Redacted Version of 267 Reply Brief in Support of MEMC's Motion for Partial Summary Judgment of Invalidity of the Asserted Aspar Patent Claims by MEMC Electronic Materials Inc..(Rogowski, Patricia) (Entered Aug. 3, 2010).
Redacted Version of 271 Reply Brief in Support of Memc's Motion for Summary Judgment of Non-Infringement by MEMC Electronic Materials Inc.. (Rogowski, Patricia) (Entered: Aug. 3, 2010).
Redacted Version of 274 Appendix Omnibus Appendix to Plaintiffs' Reply Briefs in Support of Plaintiffs' Daubert Motion and Motions for Partial Summary Judgment (Pa-1192—PA-1198 and Pa-1207—PA-1230 Filed Under Seal) by Commissariat a LEnergie Atomique, SOITEC Silicon on Insulator Technologies SA. (Kraft, Denise) (Entered: Aug. 6, 2010).
Redacted Version of 277 Reply Brief, in Support of SOITEC/CEA Parties' Motion to Exclude the Expert Report of Dr. Pascal Belton and Any Related Testimony by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 278 Reply Brief, in Support of SOITEC/CEA Parties' Motion for Summary Judgment: Non-Infringement (Filed Under Seal) by Commissariat a LEnergie Atomique, SOITEC Silicon On Insulator Technologies SA. (Attachments: # Certificate of Service)(Kraft, Denise) (Entered: Aug. 6, 2010).
Redacted Version of 279 Reply Brief in Support of Plaintiffs' Motion for Partial Summary Judgment that the Best Mode Requirement is Satisfied for the Claims of the '009 and '396 Patents (Filed Under Seal) by Commissariat a LEnergie Atomique, SOITEC Silicon On Insulator Technologies SA. (Attachments: # 1 Certificate of Service)(Kraft, Denise) (Entered: Aug. 6, 2010).
Redacted Version of 281 Reply Brief, in Support of Plaintiffs' Motion for Partial Summary Judgment that the Bruel Patent Does not Anticipate the Aspar Patents (Filed Under Seal) by Commissariat a LEnergie Atomique, SOITEC Silicon on Insulator Technologies SA. (Attachments: # 1 Certificate of Service)(Kraft, Denise) (Entered: Aug. 6, 2010).
Redacted Version of 282 Reply Brief ,, in Support of SOITEC/CEA Parties' Motion for Partial Summary Judgment that the Aspar Patents are not Invalid for Inequitable Conduct (Filed Under Seal) by Commissariat a LEnergie Atomique, SOITEC Silicon on Insulator Technologies SA. (Attachments: # 1 Certificate of Serive)(Kraft, Denise) (Entered: Aug. 6, 2010).
Notice of Service of CD of Documents MEMC0782194-MEMC0782500 and FH-10001—FH-8 0067 by MEMC Electronic Materials Inc..(Rogowski, Patricia) (Entered: Sep. 16, 2010).
Redacted Version of 301 Sealed Motion for Reconsideration Request to Modify Protective Order by Commissariat a LEnergie Atomique, SOITEC Silicon on Insulator Technologies SA. (Attachments: # Certificate of Service)(Kraft, Denise) (Entered: Sep. 24, 2010).
Redacted Version of 302 Declaration, of Michael L. Brody in Support of Motion to Reconsider Request to Modify Protective Order by Commissariat a LEnergie Atomique, Soitec Silicon on Insulator Technologies SA. (Attachments: # 1 Certificate of Service)(Kraft, Denise) (Entered: Sep. 24, 2010).
Redacted Version of 303 Exhibit to a Document Exhibit a to Michael L. Brody in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Redacted Version of 304 Exhibit to a Document Exhibit B to Michael L. Body in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Redacted Version of 305 Exhibit to a Document Exhibit C to Michael L. Body in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Redacted Version of 306 Exhibit to a Document Exhibit D to Michael L. Brody in Support of Motion to Reconsider Request to Modify Protective Order by Commissariat a LEnergie Atomique, SOITEC Silicon on Insulator Technologies SA. (Kraft, Denise) (Entered: Sep. 24, 2010).
Proposed Pretrial Order [Proposed] Joint Pretrial Order (Filed Under Seal) by Commissariat a LEnergie Atomique, Soitec Silicon on Insulator Technologies Sa, Soitec U.S.A., Inc.. (Attachments: # 1 Exhibit 1 (Sealed), # 2 Exhibit 2A (Sealed), # 3 Exhibit 2B (Sealed), # 4 Exhibit 3A (Sealed), # 5 Exhibit 3B (Sealed), # 6 Exhibit 4A (Sealed), # 7 Exhibit 4B (Sealed), # 8 Exhibit 4C (Sealed), # 9 Exhibit 5A (Sealed), # 10 Exhibit 5B (Sealed), # 11 Exhibit 6A (Sealed), # 12 Exhibit 6B (Sealed), # 13 Exhibit 7A (Sealed), # 14 Exhibit 7B (Sealed), # 15 Certificate of Service)(Kraft, Denise) (Entered: Oct. 07, 2010).

Proposed Voir Dire by MEMC Electronic Materials Inc.. (Attachments: # 1 Certificate of Service)(Rogowski, Patricia) (Entered: Oct. 8, 2010).
Verdict Sheet by MEMC Electronic Materials Inc.. (Attachments: # 1 Certificate of Service)(Rogowski, Patricia) (Entered: Oct. 8, 2010).
Proposed Voir Dire by Commissariat a LEnergie Atomique, SOITEC Silicon on Insulator Technologies SA, SOITEC U.S.A., Inc.. (Attachments: # 1 Certificate of Service)(Kraft, Denise) (Entered: Oct. 8, 2010).
Verdict Sheet by Commissariat a LEnergie Atomique, SOITEC Silicon on Insulator Technologies SA, SOITEC U.S.A., Inc.. (Attachments: # 1 Certificate of Service)(Kraft, Denise) (Entered: Oct. 8, 2010).
Proposed Jury Instructions by Commissariat a LEnergie Atomique, SOITEC Silicon on Insulator Technologies SA, SOITEC Silicon on Insulator Technologies SA, SOITEC U.S.A., Inc.. (Kraft, Denise) (Entered: Oct. 8, 2010).
Proposed Jury Instructions by Commissariat a LEnergie Atomique, SOITEC Silicon on Insulator Technologies SA, SOITEC U.S.A., Inc.. (Kraft, Denise) (Entered: Oct. 8, 2010).
Redacted Version of 315 Proposed Pretrial Order Redacted Version of [Proposed] Joint Pretrial Order by Commissariat a LEnergie Atomique, Soitec Silicon on Insulator Technologies Sa, Soitec U.S. A., Inc.. (Attachments: # 1 Exhibit 1, # 2 Exhibit 2A, # 3 Exhibit 2B, # 4 Exhibit 3A, # 5 Exhibit 3B, # 6 Exhibit 4A, # 7 Exhibit 4B, # 8 Exhibit 4C, # 9 Exhibit 5A, # 10 Exhibit 5B, # 11 Exhibit 6A, # 12 Exhibit 6B, # 13 Exhibit 7A, # 14 Exhibit 7B, # 15 Certificate of Service)(Kraft, Denise) (Entered: Oct. 13, 2010).
Memorandum Opinion. Signed by Judge Sue L. Robinson on Oct. 13, 2010. (nmf) (Entered: Oct. 13, 2010).
Order denying 141 Motion for Discovery; denying 186 Motion in Limine; granting in part and denying in part 187 Motion for Partial Summary Judgment; granting 197 Motion for Summary Judgment ; granting 199 Motion for Summary Judgment ; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting in part and denying in part 213 Motion for Partial Summary Judgment. Signed by Judge Sue L. Robinson on Oct. 13, 2010. (nmf) (Entered: Oct. 13, 2010).
Memorandum Order re: claim construction. Signed by Judge Sue L. Robinson on Oct. 13, 2010. (nmf) (Entered: Oct. 13, 2010) Oral Order by Judge Sue L. Robinson on Oct. 14, 2010 that the responses to the issues raised in the exhibits to the joint pre-trial order are to be stricken from the record. (These filings, formerly D.I. Nos. 318 and 323 have been deleted from the docket.) (nmf) (Entered: Oct. 14, 2010).
Amended Order denying 141 Motion for Discovery; denying 186 Motion in Limine; granting in part and denying in part 187 Motion for Partial Summary Judgment; granting 197 Motion for Summary Judgment ; granting 199 Motion for Summary Judgment ; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; *granting* 213 Motion for Partial Summary Judgment. Signed by Judge Sue L. Robinson on Oct. 14, 2010. (nmf) (Entered: Oct. 14, 2010) Minute Entry for proceedings held before Judge Sue L. Robinson - Final Pretrial Conference held on Oct. 14, 2010. (Court Reporter V. Gunning.) (nmf) (Entered: Oct. 15, 2010) SO Ordered, re 315 Proposed Pretrial Order. Signed by Judge Sue L. Robinson on Oct. 14, 2010. (nmf) (Entered: Oct. 15, 2010).
Motion for Reargument re 327 Memorandum and Order—Reargument of Claim Construction of One Claim Term of U.S. Patent 6,809,009 - filed by MEMC Electronic Materials Inc.. (Rogowski, Patricia) (Entered: Oct. 18, 2010).
Second Amended Order re: 325 denying 141 Motion for Discovery; denying 186 Motion in Limine; granting in part and denying in part 187 Motion for Partial Summary Judgment; granting 197 Motion for Summary Judgment ; granting 199 Motion for Summary Judgment

**with respect to the '484 patent and with respect to its current process, and denied in other respects; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting 213 Motion for Partial Summary Judgment. Signed by Judge Sue L. Robinson on Oct. 19, 2010. (nmf) (Entered: Oct. 19, 2010).
Memorandum Order granting 329 Motion for Reargument re 327 Memorandum and Order—Reargument of Claim Construction of One Claim Term of U.S. Patent 6,809,009. Signed by Judge Sue L. Robinson on Oct. 19, 2010. (nmf) (Entered: Oct. 19, 2010).
Stipulation MEMC's Declaratory Judgment counterclaim asserting invalidity of United States Reissued Patent No. 39,484 in Civil Action No. 1:08-292-SLR is dismissed without prejudice by Commissariat a LEnergie Atomique, Soitec Silicon on Insulator Technologies SA, SOITEC U.S.A., Inc.. (Kraft, Denise) (nmf, ). (Entered: Oct. 21, 2010).
Stipulation of Fact re 331 Memorandum and Order, 327 Memorandum and Order, 325 Memorandum Opinion by Commissariat a LEnergie Atomique, SOITEC Silicon on Insulator Technologies SA, SOITEC U.S.A., Inc.. (Kraft, Denise) (Entered: Oct. 21, 2010).
Letter to the Honorable Sue L. Robinson from Denise Seastone Kraft regarding Mutually agreed upon narrowing of the issues for trial—re 333 Stipulation, 332 Stipulation ,. (Kraft, Denise) (Entered: Oct. 21, 2010) Correcting Entry:The pdf of D.I. 332 has been replaced with the correct pdf of the stipulation per request of filter. (nmf) (Entered: Oct. 22, 2010)So Ordered, re 333 Stipulation filed by SOITEC Silicon on Insulator Technologies SA, SOITEC U.S.A., Inc., Commissariat a LEnergie Atomique. Signed by Judge Sue L. Robinson on Oct. 22, 2010. (nmf) (Entered: Oct. 22, 2010).
Voir Dire Questions. Read in Open Court Oct. 25, 2010.(nmf) (Entered: Oct. 25, 2010).
Preliminary Jury Instructions. Read in Open Court Oct. 25, 2010. (nmf) (Entered: Oct. 25, 2010) Minute Entry for proceedings held before Judge Sue L. Robinson: Jury Trial Day 1 held on Oct. 25, 2010. (Court Reporter Valerie Gunning, Brian Gaffigan.) (dlk) (Entered: Oct. 26, 2010).
Plaintiff'S Bench Memorandum. Filed in Court Oct. 26, 2010. (nmf) (Entered: Oct. 26, 2010) Minute Entry for proceedings held before Judge Sue L. Robinson - Jury Trial (Day 2) held on Oct. 26, 2010. (Court Reporter Valerie Gunning, Kevin Maurer.) (dlk) (Entered: Oct. 26, 2010) Minute Entry for proceedings held before Judge Sue L. Robinson - Jury Trial - Day 3, held on Oct. 27, 2010. (Court Reporter Valerie Gunning/Kevin Maurer.) (nms) (Entered: Oct. 27, 2010).
Statement—Bench Memorandum Supporting Memc'S Proffer of Admissions by Soitec in Prior Lawsuit Involving the '564 Patent submitted at trial by Memc Electronic Materials Inc.. (Attachments: # 1 Exhibit a)(Rogowski, Patricia) (Entered: Oct. 28, 2010) Minute Entry for proceedings held before Judge Sue L. Robinson—Jury Trial—Day 4 held on Oct. 28, 2010. (Court Reporter Valerie Gunning/Kevin Maurer.) (nms) (Entered: Nov. 01, 2010).
Final Jury Instructions read in open Court by Judge Robinson. (lid) (Entered: Nov. 01, 2010) Minute Entry for proceedings held before Judge Sue L. Robinson—Jury Trial held on Nov. 1, 2010. (Day 5) (Court Reporter V. Gunning.) (lid) (Entered: Nov. 2, 2010) Minute Entry for proceedings held before Judge Sue L. Robinson—Jury Trial completed on Nov. 2, 2010. (Day 6) (Court Reporter V. Gunning.) (lid) (Entered: Nov. 2, 2010).
Redacted Version of 342 Jury Verdict. (lid) (Entered: Nov. 2, 2010).
Statement Bench Memorandum in Support of Plaintiffs' Motion for Judgment as a Matter of Law of no Unenforceability of the '009 Patent Due to Inequitable Conduct submitted at trial by Commissariat a LEnergie Atomique, Soitec Silicon on Insulator Technologies SA, Soitec U.S.A., Inc.. (Attachments: # 1 Certificate of Service)(Kraft, Denise) (Entered: Nov. 2, 2010).
Answering Brief in Opposition re 301 Sealed Motion for Reconsideration Request to Modify Protective Order (MEMC'S Opposition to Plaintiffs' Motion for Reargument Re: Modification of the Protective Order) filed by MEMC Electronic Materials Inc..Reply Brief due date per Local Rules is Nov. 22, 2010. (Attachments: # 1 Exhibit 1 through 5, # 2 Certificate of Service)(Rogowski, Patricia) (Entered: Nov. 12, 2010).
Judgment in favor of defendant MEMC Electronic Materials, Inc. And against plaintiffs S.O.I.Tec Silicon on Insulator Technologies, S.A. And Commisseriat a LEnergie Atomique et aux Energies Alternatives as to the 812 patent. It Is Further Ordered that judgment be and is hereby entered in favor of plaintiffs S.O.I.TEC Silicon on Insulator Technologies, S.A. and Commisseriat a LEnergie Atomique et aux Energies Alternatives and against defendant MEMC Electronic Materials, Inc. as to the 009 patent. Signed by Judge Sue L. Robinson on Nov. 15, 2010. (nmf) (Entered: Nov. 15, 2010).
Stipulation Setting Post-Trial Briefing Schedule re 348 Judgment,, by Commissariat a LEnergie Atomique, MEMC Electronic Materials Inc., SOITEC Silicon on Insulator Technologies SA. (Rogowski, Patricia) (Entered: Nov. 15, 2010).
Motion for Reargument re 348 Judgment,, (MEMCS Motion for Reargument of the Courts Order Re: The Unenforceability of the 009 Patent)—filed by MEMC Electronic Materials Inc..(Attachments: # Exhibit 1)(Rogowski, Patricia) (Entered: Npv. 16, 2010) So Ordered- re 349 Stipulation. Sep Post Trial Briefing Schedule: (Opening Brief due Dec. 8, 2010., Answering Brief due Dec. 29, 2010., Reply Brief due Jan. 12, 2010.). Signed by Judge Sue L. Robinson on Nov. 17, 2010. (id) (Entered: Nov. 17, 2010).
Motion for Leave to File Reply in Support of Plaintiff's Motion for Reargument—filed by Commissariat a LEnergie Atomique, Soitec Silicon on Insulator Technologies Sa. (Attachments: # 1 Text of Proposed Order, # 2 Certificate of Service)(Kraft, Denise) (Entered: Nov. 23, 2010).
Opening Brief in Support re 301 Sealed Motion for Reconsideration Request to Modify Protective Order, 351 MOTION for Leave to File Reply in Support of Plaintiff's Motion for Reargument filed by Commissariat a LEnergie Atomique, SOITEC Silicon on Insulator Technologies SA.Answering Brief/Response due date per Local Rules is Dec. 10, 2010. (Attachments: # 1 Appendix A, # 2 Certificate of Service)(Kraft, Denise) (Entered: Nov. 23, 2010).
Stipulation to Extend Time Respond to MEMC's Motion for Reargument of the Court's Order Re: Unenforceability of the '009 Patent to Dec. 3, 2010—filed by Commissariat a LEnergie Atomique, SOITEC Silicon on Insulator Technologies SA, SOITEC U.S.A., Inc.. (Attachments: # 1 Certificate of Service)(Kraft, Denise) (Entered: Nov. 24, 2010) So Ordered- re 353 Stipulation to Extend Time. Set Briefing Schedule: re 350 Motion for Reargument re 348 Judgment,. (Answering Brief due Dec. 3, 2010.). Signed by Judge Sue L. Robinson on Nov. 30, 2010. (lid) (Entered: Nov. 30, 2010).
Stipulation to Extend Time to file Motions and Opening Post-Trial Briefs to Dec. 13, 2010—filed by Commissariat a LEnergie Atomique, SOITEC Silicon on Insulator Technologies SA, Soitec U.S.A., Inc.. (Kraft, Denise) (Entered: Dec. 3, 2010).
Reply Brief re 350 Motion for Reargument re 348 Judgment (MEMCS Motion for Reargument of the Courts Order Re; The Unenforceability of the 009 Patent) (Paintiffs' Opposition to MEMC's Motion for Reargument of the Court's Order Re: The Unenforceability of the '009 Patent filed by Commissariat a LEnergie Atomique, SOITEC Silicon on Insulator Technologies SA, SOITEC U.S.A., Inc.. (Attachments: # 1 Exhibit A, # 2 Certificate of Service)(Kraft, Denise) (Entered: Dec. 3, 2010) So Ordered- re 354 Stipulation to Extend Time. Set Briefing Schedule: (Post Trial Opening Brief due Dec. 13, 2010.). Signed by Judge Sue L. Robinson on Dec. 6, 2010. (id) (Entered: Dec. 6, 2010).
Exhibit re 355 Reply Brief, Exhibit B to Plaintiffs' Opposition to MEMC's Motion for Reargument of the Court's Order Re: The Unenforceability of the '009 Patent by Commissariat a LEnergie Atomique, SOITEC Silicon on Insulator Technologies SA, SOITEC U.S.A., Inc.. (Kraft, Denise) (Entered: Dec. 6, 2010).
Answering Brief in Opposition re 351 Motion for Leave to File Reply in Support of Plaintiff's Motion for Reargument filed by MEMC Electronic Materials Inc..Reply Brief due date per Local Rules is Dec. 20, 2010. (Rogowski, Patricia) (Entered: Dec. 10, 2010).
Stipulation to Extend Time Stipulation and Order for Plaintiffs to file Motions and Opening Post-Trial Briefs to Dec. 14, 2010—filed by Commissariat a LEnergie Atomique, SOITEC Silicon on Insulator Technologies SA, SOITEC U.S.A., Inc.. (Kraft, Denise) (Entered: Dec. 13, 2010).
Motion for Judgment as a Matter of Law—MEMC'S Renewed Motion for Judgment As a Matter of Law or in the Alternative for a New Trial - filed by Memc Electronic Materials Inc.. (Rogowski, Patricia) (Entered: Dec. 13, 2010).
Opening Brief in Support re 359 MOTION for Judgment as a Matter of Law—MEMC'S Renewed Motion for Judgment as a Matter of LAw or in the Alternative for a New Trial filed by MEMC Electronic Materials Inc..Answering Brief/Response due date per Local Rules is Dec. 30, 2010. (Attachments: # 1 Exhibit 1, # Certificate of Service of Service)(Rogowski, Patricia) (Entered: Dec. 13, 2010).
Motion for Judgment as a Matter of Law Plaintiffs' Renewed Motion for Judgment As a Matter of Law or in the Alternative for a New Trial—filed by Commissariat a LEnergie Atomique, SOITEC Silicon on Insulator Technologies SA. (Attachments: # 1 Text of Proposed Order, # 2 Certificate of Service)(Kraft, Denise) (Entered: Dec. 14, 2010).
Opening Brief in Support re 361 Motion for Judgment as a Matter of Law Plaintiffs' Renewed Motion for Judgment As a Matter of Law or in the Alternative for a New Trial filed by Commissariat a LEnergie Atomique, Soitec Silicon on Insulator Technologies Sa.Answering Brief/Response due date per Local Rules is Jan. 3, 2011. (Attachments: # 1 Certificate of Service)(Kraft, Denise) (Entered: Dec. 14, 2010).
Motion for Injunctive Relief Plaintiffs' Motion for Injunctive Relief and to Lift Stay on Damages Discovery—filed by Commissariat a LEnergie Atomique, SOITEC Silicon on Insulator Technologies SA. (Attachments: # 1 Text of Proposed Order, # 2 Certificate of Service)(Kraft, Denise) (Entered: Dec. 14, 2010).
Stipulation to Extend Time due date for Answering and Reply Post-Trial Briefs to Jan. 7, 2011 for Answering Brief and Jan. 21, 2011 for Reply Brief—filed by MEMC Electronic Materials Inc..(Rogowski, Patricia) (Entered: Dec. 15, 2010) So Ordered- re 365 Stipulation to Extend Time. Set Briefing Schedule: (Answering Post trial Brief due Jan. 7, 2011., Reply post trial Brief due Jan. 21, 2011.). Signed by Judge Sue L. Robinson on Dec. 16, 2010. (lid) (Entered: Dec. 17, 2010).
Stipulation to Extend Time Post-Trial Answering Briefs to Jan. 12, 2011—filed by MEMC Electronic Materials Inc.. (Rogowski, Patricia) (Entered: Jan. 6, 2011).
Notice of Appearance by Aleine Michelle Porterfield on behalf of Commissariat a LEnergie Atomique, SOITEC Silicon on Insulator Technologies SA, SOITEC U.S.A., Inc. (Attachments: # 1 Certificate of Service)(Porterfield, Aleine) (Entered: Jan. 7, 2011).
Joint Stipulation to Extend Time Post-trial Answering Briefs and Post-trial Reply Briefs to Jan. 14, 2011 and Jan. 28, 2011—filed by MEMC Electronic Materials Inc.. (Rogowski, Patricia) (Entered: Jan. 12, 2011).
Answering Brief in Opposition re 359 Motion for Judgment as a Matter of Law—MEMC'S Renewed Motion for Judgment As a Matter of Law or in the Alternative for a New Trial filed by Commissariat a LEnergie Atomique, Soitec Silicon on Insulator Technologies Sa, SOITEC U.S.A., Inc..Reply Brief due date per Local Rules is Jan. 24, 2011. (Attachments: # 1 Certificate of Service)(Kraft, Denise) (Entered: Jan. 14, 2011).
Answering Brief in Opposition, re 361 MOTION for Judgment as a Matter of LAw Plaintiffs' Renewed Motion for Judgment as a Matter of Law or in the Alternative for a new Trial) filed by MEMC Electronic Materials Inc..Reply Brief due date per Local Rules is Jan. 24, 2011. (Attachments: # 1 Certificate of Service)(Rogowski, Patricia) (Entered: Jan. 14, 2011).
Declaration re 378 Answering Brief in Opposition, (Declaration of Robert M. Evans, Jr. In Support of MEMCS Opposition to Plaintiffs Renewed Motion for Judgment as a Matter of Law or in the Alternative for a new Trial) by MEMC Electronic Materials Inc.. (Attachments: # Exhibit 1, # 2 Exhibit 2, # 3 Certificate of Service)(Rogowski, Patricia) (Entered: Jan. 14, 2011).
Redacted Version of 376 Answering Brief in Opposition, to Plaintiffs' Motion for Injunctive Relief and to Lift Stay on Damages Discovery by MEMC Electronic Materials Inc.. (Attachments: # 1 Certificate of Service)(Rogowski, Patricia) (Entered: Jan. 20, 2011).

Redacted Version of 377 Appendix to MEMC's Answering Brief in Oppositon to Plaintiffs' Motion for Injunctive Relief and to Lift Stay on Damages Discovery by MEMC Electronic Materials Inc.. (Attachments: # 1 Exhibits 1-7, 190 2 Exhibits 8, # 3 Exhibits 9, # 4 Exhibit 10, # 5 Exhibit 11, # 6 Exhibit 12-13, # 7 Exhibit 14, # 8 Exhibit 15, 190 9 Exhibit 16, # 10 Exhibit 17, # 11 Exhibit 18, # 12 Exhibit 19, # 13 Certificate of Service)(Rogowski, Patricia) (Entered: Jan. 20, 2011).

Joint Stipulation to Extend Time of Post-Trial Reply Briefs to Tuesday, Feb. 1, 2011—filed by Commissariat a LEnergie Atomique, SOITEC Silicon on Insulator Technologies SA, SOITEC U.S.A., Inc.. (Kraft, Denise) (Entered: Jan. 28, 2011).

Joint Stipulation to Extend Time of Post-Trial Reply Briefs to Friday, Feb. 4, 2011—filed by Commissariat a LEnergie Atomique, SOITEC Silicon on Insulator Technologies SA, Soitec U.S.A., Inc.. (Kraft, Denise) (Entered: Jan. 31, 2011).

Redacted Version of 364 Opening Brief in Support,,,, Redacted Version of Motion for Injunctive Relief and to Lift Stay on Damages Discovery by Commissariat a LEnergie Atomique, SOITEC Silicon on Insulator Technologies SA, SOITEC U.S.A., Inc.. (Attachments: # 1 Exhibit A, # 2 Exhibit B, # 3 Exhibit C, # 4 Exhibit D, # 5 Exhibit E, # 6 Exhibit F, # 7 Exhibit G, # 8 J, # 11 Exhibit K, # 12 Exhibit L, # 13 Exhibit M, # 14 Exhibit N, # 15 Exhibit O, # 16 Exhibit P, # 17 Exhibit Q, # 18 Exhibit R, # 19 Exhibit S)(Kraft, Denise) (Entered: Feb. 2, 2011).

Reply Brief re 359 Motion for Judgment as a Matter of Law—MEMC'S Renewed Motion for Judgment As a Matter of Law or in the Alternative for a New Trial filed by MEMC Electronic Materials Inc.. (Attachments: # 1 Certificate of Service)(Rogowski, Patricia) (Entered: Feb. 4, 2011).

Reply Brief re 361 Motion for Judgment as a Matter of Law Plaintiffs' Renewed Motion for Judgment as a Matter of Law or in the Alternative for a New Trial filed by Commissariat a LEnergie Atomique, SOITEC On Insulator Technologies SA, SOITEC U.S.A., Inc.. (Attachments: # Certificate of Service)(Kraft, Denise (Entered: Feb. 4, 2011).

Declaration re 387 Reply Brief, Declaration of Michael L. Brody in Support of Reply Brief In Support of Plaintiffs' Renewed Motion for Judgment as a Matter of Law or in the Alternative for a New Trial by Commissariat a LENergie Atomique, SOITEC Silicon on Insulator Technologies SA, SOITEC U.S.A., Inc.. (Attachments: # 1 Exhibit A, # 2 Certificate of Service)(Kraft, Denise) (Entered: Feb. 4, 2011).

Motion to Strike 386 Reply Brief, Motion By Plaintiffs' To Strike Reply Brief In Support to MEMC's Renewed Motion for Judgment as a Matter of Law or, In the Alternative, a New Trial (D.I. 386—file by Commissariat a LEnergie Atomique, SOITEC Silicon On Insulator Technologies SA, SOITEC U.S.A., Inc.. (Attachments: # 1 Certificate of Service)(Kraft, Denise) (Entered: Feb. 8, 2011).

Opening Brief in Support re 390 MOTION to Strike 386 Reply Brief, Motion By Plaintiff's To Strike Reply Brief In Support of MEMC's Renewed Motion for Judgment as Matter of Law or, In the Alternative, a New Trial (D.I. 386) MOTION to Strike 386 Reply Brief, Motion by Plaintiffs' To Strike Reply Brief In Support of MEMC's Renewd Motion For Judgment as a Matter of Law or, In The Alternative, a New Trial (D.I. 386) filed by Commissariat a LEnergie Atomique, SOITEC Silicon On Insulator Technologies SA, SOITEC U.S.A., Inc..Answering Brief/Response due date per Local Rules is Feb. 25, 2011. (Attachments: # 1 Certificate of Service)(Kraft, Denise) (Entered: Feb. 8, 2011).

Declaration re 391 Opening Brief in Support,, Declaration of Marcus T. Hall in Support of Plaintiffs' Opening Brief in Support of Motion to Strike Reply Brief in Support if MEMC's Renewed Motion for Judgment as a Matter of Law or, In The Alternative, a New Trial (D.I. 386) by Commissariat a LEnergie Atomique, SOITEC Silicon on Insulator Technologies SA, SOITEC U.S.A., Inc.. (Attachment: #1 Exhihit A, # 2 Certificate of Service)(Kraft, Denise) (Entered: Feb. 8, 2011).

Redacted Version of 389 Reply Brief, Redacted Version of Reply Brief in Support of Plaintiffs' Motion for Injunctive Relief and to Lift Stay on Damages Discovery by Commissariat a LEnergie Atomique, SOITEC Silicon on Insulator Technologies SA, SOITEC U.S.A., Inc.. (Kraft, Denise) (Entered: Feb. 9, 2011).

* cited by examiner

METHOD FOR SELF-SUPPORTED TRANSFER OF A FINE LAYER BY PULSATION AFTER IMPLANTATION OR CO-IMPLANTATION

This application is a 35 U.S.C. 371 national application of PCT application No. PCT/FR2004/002779 and claims priority to French patent application No. 0312621, filed Oct. 28, 2003.

TECHNICAL FIELD

The invention relates to a method of transferring an ultrafine film (the term thin or ultrathin film is also used) using self-supported propagation of a fracture initiated by a pulse of energy. It has applications in particular in the fields of microelectronics, micro-mechanics, optics and integrated electronics.

BACKGROUND

As is known, splitting a thin film may be achieved by implantation of chemical species in a source substrate, for example of silica, to induce the formation of a zone of defects at a particular depth. These defects may be micro-bubbles and/or platelets and/or micro-cavities and/or dislocation loops and/or other crystalline defects, locally disrupting the crystalline quality of the material; their nature, density and size are strongly dependent on the species implanted (typically hydrogen) as well as on the nature of the source substrate. A heat-treatment may then be applied to enable the development of specific defects present in the weakened zone, which enables splitting of the thin film from the source substrate to be achieved later. This has in particular been described in U.S. Pat. No. 5,374,564 and developments thereof, such as described in U.S. Pat. No. 6,020,252.

However, spontaneous splitting during thermal annealing is sometimes ill-suited to certain situations, for example when the substrates brought into contact have different coefficients of thermal expansion. Moreover, it is known in the art (see for example US published patent application no.—2003/0134489) that, in the case of a fracture obtained by thermal means, and under certain conditions, the latter preferentially commences at a localized place on the wafer, which can sometimes lead to surface non-homogeneities that are reflected in the form of a "marbled" type appearance. These irregularities also appear in the case of a purely thermal fracture when attempting to overfragilize by implanting an overdose of a species such as hydrogen in such a manner as to facilitate the fracture thereof or to minimize the thermal budget (temperature-duration) subsequently applied to the wafers.

When the splitting is produced at high temperature (typically near approximately 500° C.), among the technological problems sometimes encountered, mention should be made of the roughness of the surface as well as the degradation of the film transferred during the thermal splitting. This renders the following treatment steps more difficult (for example: the transferred film must be polished more, there is a risk of crystalline defects being created during the following treatments, etc.). Furthermore, in heterostructures (comprising a superposition of substrates of different materials), another technological problem encountered is the presence of a field of very high stresses in the various films in contact, during the heat treatment, due to the difference in the coefficients of thermal expansivity of the various materials placed in contact. This may induce the degradation of the heterostructures if the thermal splitting occurs at a temperature higher than a critical temperature. This degradation may, typically, be the breakage of one or both substrates brought into contact and/or be the unbending of the substrates at the bonding interface.

This is the reason why it may be desired to achieve the splitting at lower temperature.

One way to achieve splitting at low temperature is to "play" with the implantation conditions. For example, an excess dose of the implanted species may increase the weakening of the implanted zone and cause splitting at low temperature by providing an external force.

Splitting may also be effected by applying an external force that causes the fracture in the weakened area until the thin layer is detached, generally after heat treatment. See in particular U.S. Pat. No. 6,225,192.

It is important to note that, for a given substrate and given implantation conditions, it is not only the treatment temperature that conditions the subsequent conditions of splitting of the thin layer, but also the duration of that treatment, which is reflected in the thermal budget concept (see French Patent No. FR-2 767 416); as for the provision of mechanical energy, it is applied for example by a "guillotine" type tool (see PCT Published Patent Application No. WO 02/083387).

Thus Henttinen et al. (2000) showed that, if the source substrate is a wafer of silicon, a dose of hydrogen ions implanted at $1\times10^{17}$ $H^+/cm^2$ (i.e. $5\times10^{16}$ $H_2/cm^2$), enables splitting by a mechanical force after performing the following steps: treatment, as for the target substrate, by a plasma chemical activation; cleaning of RCA1 type, bonding at ambient temperature of the source substrate onto the target substrate, and annealing at 200° C. for 2 hours. (K. Henttinen et al., Applied Physics Letters, Volume 16, Number 17, 24 Apr. 2000; pp. 2370-2372). The mechanical force utilized came from a blade inserted at the bonded interface to initiate the splitting.

This approach, although reducing the roughness of the transferred surface (by of the order of half with respect to conventional splitting solutions that are purely thermal and without plasma activation), involves slow and jerky propagation of the fracture wave. Thus Henttinen reports that each forward movement of the blade leads to the propagation of a fracture that is stabilized over a certain distance after two minutes.

This type of mechanical splitting therefore consists of introducing a blade from the edges of the structure and moving this blade forward over virtually all of the bonded structure, as if to "cut it out" along the weakened zone; the term 'assisted splitting' is sometimes used, since the role of the tool (such as a blade) is to propagate the fracture wave from one edge of the structure to the other.

This type of fracture leads to the following defects, at the future surface freed by the splitting of the thin film: 1) crown defect (non-transferred zone, at the periphery of the final product), for example related to a local bonding energy too low with respect to the rest of the interface, and to the introduction of tools to start off the transfer, 2) lack of uniformity (low frequency roughness) of the thickness of the thin film transferred, in particular due to the fracture wave assisted mechanically, thus irregular, by fits and starts, which then necessitates treatments, such as polishing, which it is however generally sought to avoid, and 3) difficult industrial implementation, given the use of a tool which accompanies the propagation of the fracture, which implies an individual treatment of each structure (or wafer).

Moreover, it has been found that, if the thermal budget is too low, the transfer of the thin film is of poor quality, whereas if it is too high, fracture of one of the substrates may occur in the case of a heterostructure. It is therefore clear that in theory there is a narrow window for the operating parameters (of course linked to the conditions, in particular the doses implanted, the nature of materials, the annealing temperatures, and the like); now, this narrowness constitutes a heavy constraint for industrial exploitation.

Most of these drawbacks are found in the case of the splitting of a thin film in a homogeneous substrate (with a single component material (silicon-on-insulator (SOI), for example).

The splitting of the thin film is of course also determined by the choice of the chemical species implanted.

It was indicated above that hydrogen is generally implanted, but other options have been proposed, in particular by implanting helium.

Combination may even be made of two different chemical species.

Thus Agarwal et al. (1998) found that the fact of implanting both hydrogen and helium enabled the total implanted dose of ions to be reduced, apparently due to the different roles played by hydrogen and helium: the hydrogen interacts with the Si—Si bonds broken by the implantation, to create Si—H bonds, resulting in a high density of platelet type defects of a size of the order of 3-10 nm (termed H-defects of platelet type), whereas helium, which does not act chemically, leads to the appearance of a lower density of larger defects (size greater than 300 nm approximately). (A. Argawal et al. Applied Physics Letters, volume 72, Number 9, 2 Mar. 1998; pp. 1086-1088). The heat treatments envisaged in that article are 450° C. for 20 min or 750° C. for 20 s, which necessarily implies the drawbacks mentioned above in relation to splitting at high temperature.

This hydrogen-helium combination has also been studied, in a more theoretical manner, by Cerofolini et al. (2000) [3], who noted that pressurization of the defects was greater with the implantation of helium than with that of hydrogen, and that the heat treatment could have different effects according to the temperature chosen: annealing between 150° C.-250° C. leads to a reduction in the number of Si—H bonds, annealing in the range 300° C.-450° C. leads on the contrary to an increase in that number, whereas annealing above 550° C. tends instead to reduce that number again. (G. F. Cerofolini et al., Materials Science and Engineering B71-2000, pp. 196-202). However that article does not deduce practical conclusions therefrom as to the manner of obtaining thin films of good quality (in particular in relation to the state of the surface) for a moderate cost.

An object of the invention is to alleviate the drawbacks described above.

More particularly, the invention relates to a method of transferring a thin film that can be carried out at low temperature (in order to limit the high mechanical stresses when using materials having large coefficient of expansion differences), that can be effected collectively and limiting the defects cited above during splitting of the thin layer, in particular by preventing jerking of the fracture wave. In other words, an object of the invention is to obtain, for a moderate cost, thin films of high quality, thereby avoiding at the same time the drawbacks of a heat treatment at high temperature and those related to the utilization of a tool for assisted splitting, and those related to an additional treatment for reducing roughness after splitting.

SUMMARY

To that end the invention provides a method of self-supported transfer of a thin film according to which:

a source substrate is prepared, at least a first species of ions or gas in a first dose at a given depth is implanted in that source substrate with respect to a face of that source substrate, that first species being adapted to generate defects, a stiffener is applied in intimate contact with the source substrate, a heat treatment is applied to that source substrate, at a given temperature for a given time, so as to create, substantially at the given depth, a buried weakened zone, without initiating the thermal splitting of the thin film, a pulse of energy is applied to that source substrate so as to provoke the self-supported splitting of a thin film delimited between the face and the buried weakened layer, with respect to the remainder of the source substrate.

Self-supported splitting may be defined here as being a complete and virtually instantaneous splitting, similar to that obtained by a simple heat treatment at high temperature, but possibly induced by a tool without it having to follow any kind of fracture wave (if there is a tool, it comes at most into contact with the substrate and the film, without following the splitting interface); this is thus, in other words, the contrary of an assisted splitting. It may also be referred to as a "self-supported" phenomenon.

Two species, for example hydrogen and helium, may preferably be co-implanted, as described in the French Patent application No. FR-2847075 or the PCT Published Patent application No. WO-04/044976; the implantation of a plurality of species can be concomitant or not.

The heat treatment temperature is advantageously chosen to promote the development of crystalline defects in the weakened area without in so doing leading to spontaneous thermal splitting. This temperature will be sufficiently low not to generate mechanical stresses that are too high in the substrate assuming that the source substrate and/or any target substrate include materials having very different coefficients of expansion. This is why the method is a transfer method occurring at a relatively low temperature (not greater than 500° C. in the case of a silicon/quartz heterostructure, for example).

According to the invention, the fracture is obtained by propagation of a self-supported fracture wave, after the latter has been initiated by an energy pulse applied in a fragile area (this pulse being local or global). To obtain this phenomenon, implantation conditions (dose, energy, nature of the species, current, order of implantations (if there is more than one) and relative positions in the depth of the substrate of the implanted species (in the case of implanting a plurality of species), implantation temperature, etc.) and appropriate treatment (for example heat treatment) would seem to enable shaping of the distribution, the morphology, the size of the crystalline defects (cavities, platelets, microbubbles and macrobubbles and other types of defects) that form the fragile area. It is precisely the work of shaping the fragile area that seems to enable the result of self-supported fracture to be obtained.

The invention consists in promoting weakening conditions close, in their nature, to the conditions obtained in the event of thermal fracture, without going so far. The additional energy is then provided by impulsional addition of energy at the end of or during the heat treatment, and induces the propagation of a self-supported fracture.

Self-supported propagation of the fracture wave means that it is not necessary to assist the propagation of the wave by advancing a tool or repeating the initiation energy pulse. Also, an important feature of the invention is that the fracture wave is propagated over the whole of the surface of the wave in less than 1 second, or even of the order of one millisecond (speeds greater than 100 m/s) for diameters up to 300 mm.

One possible origin of the self-supported (or self-supported) fracture stems from the nature of the buried defects. Research (on germanium, but applicable to silicon) has shown that under self-supported fracture conditions the density of defects (microcracks, cavities, platelets, microbubbles, macrobubbles, etc.) is estimated to be from 0.03 to 0.035 per square micron, their sizes are of the order of 7 to 8 square microns, and the area opened up by these defects, as a percentage of the total area of the wafer, is estimated to be from 25 to 32%. These values characteristic of the weakened area might seem similar to characteristic values noted if the fracture is obtained by thermal means, but different from those obtained after weakening treatment that necessitates assisted mechanical fracture (in which case, the percentage of the area opened up is more of the order of 10%).

At least the condition cited above as to the area opened up is preferably applied (it seems to be the most important; it seems that it may be generalized to a range from 20% to 35%), where appropriate complemented by either or both of the conditions as to the density or the size of the defects.

Of course other effects or causes are not excluded by this interpretation, and in particular the chemical nature of the bonds in the substrate may also promote the occurrence of the phenomenon of self-supported fracture wave.

In other words, the invention seems to consist in promoting weakening conditions close, in their nature, to the conditions obtained in the case of thermal fracture, without going so far. The additional energy is then provided by impulsional addition of energy.

It must be emphasized that it was not obvious for the person skilled in the art to arrive at such conditions enabling a self-supported fracture to be obtained, even if that result might seem in itself to be extremely desirable.

The person skilled in the art, seeking to improve the results of mechanical fracture, might have been incited to fragilize the substrate more, for example by increasing the thermal budget input to the implanted structure bonded to the stiffener substrate. And the person skilled in the art would have been able to verify that, by increasing the thermal budget, the force necessary to propagate the bonding wave was indeed reduced. However, he would not have been able to observe the self-propagated fracture wave phenomenon, which is produced only under particularly favorable conditions (see below). In particular, the person skilled in the art would not have thought to continue weakening as far as an ideal point that precedes the moment of thermal fracture, as under general conditions of implantation and of heat treatment, that point is an unstable point that it would be hazardous or futile to seek to achieve. In particular in the case of fabrication of heterostructures, passing this unstable point, and therefore the thermal fracture of the substrate, often leads to complete breaking of the final product linked to the sudden releasing, at the time of the fracture, of the stresses of thermomechanical origin stored in the bonded substrates.

Accordingly, and at most, the person skilled in the art would have expected that the continuous force necessary to propagate the fracture wave would be less. Thus in particular he would have had no objective reason to think that simply prolonging the weakening annealing (over the prior art) followed by the application of an impulsional force would lead to a self-supported fracture wave.

In fact, the impulsional energy application may be global (thermal shock, ultrasound, etc.) or localized (laser, mechanical shock, traction force, etc.).

This pulse is preferably localized, and advantageously applied by a tool moved briefly with a small amplitude. This addition of energy is advantageously applied in the immediate proximity of the buried layer, limited to only a portion thereof, preferably to a peripheral portion thereof.

This pulse may also in particular consist of a localized thermal provision (for example applied by a laser pulse) or an external stress (for example in the immediate vicinity of the weakened area, at an edge thereof).

For reasons of simplicity of implementation, the fracture may be obtained at around room temperature (0 to 50° C.), for example by application of a mechanical shock localized to the border of the assembly. However, this particular embodiment is not limiting on the invention, and in certain situations it may be preferable to initiate the fracture at a higher temperature, for example around 300° C.

It has been observed that the energy pulse has had all its effectiveness for initiating the fracture wave when the latter led to a very localized opening up of the interface at the level of the fragile layer. Thus a shock provided by a blade type tool, or more generally any traction type force, induces the propagation of a self-supported fracture very effectively.

If the complementary treatment is carried out in the form of the application of a thermal budget, the latter is less than the thermal budget necessary to obtain the fracture.

The surface state of the substrate formed after fracture has high-frequency and low-frequency roughnesses improved over the prior art. This result is particularly pronounced for the low frequencies, in particular with the absence of fracture waves. It is assumed that this result is linked to the fact that, in the context of the invention, the fracture wave propagates continuously, without jerks and within a highly weakened layer (which would facilitate the propagation of the wave in a preferential area within the weakened layer), compared to what is obtained in the prior art.

Under standard implantation conditions (implantation of $H^+$ of the order of $5 \times 10 \ 10^{16}$ at/$cm^2$ from 20 to 300 keV in silicon—Si) the self-supported fracture phenomenon is observed only for narrow operating points, which it may be difficult to reproduce systematically.

On the other hand, under different conditions, in particular, the operating window to obtain the self-supported fracture phenomenon is wide, which means that this phenomenon is observable for a wide variation of the parameters for obtaining the fragile layer (parameters of implantation and of the additional heat treatments, in particular). This is the case, for example, when the implantation is a co-implantation under defined conditions (see below) and/or when the temperature profile of the additional treatment includes adapted phases. In the context of industrial use, it is important to make the method rugged vis à vis drift, inaccuracies and variations of the operating parameters which are inevitable, of course. In practice, this great ruggedness authorizes the use of the method for batches of wafers, rather than wafer by wafer, as is standard practice in the microelectronics industry. Thus it has been possible to verify that it was possible to obtain the fracture over a batch of wafers (25 wafers) using a wafer manipulation tool like that disclosed in WO03013815. It was also noted that the time necessary to implement the method corresponds substantially to the time to implement the prior art methods.

In other words, according to one particular aspect of the invention, the latter proposes a method of fabricating a batch of substrates including the following steps:

implantation of each of the substrates, weakening treatment of the substrates as a batch, application of energy pulses simultaneously to each of the substrates (collective treatment).

It seems that it should be noted that, according to the invention, the substrate is weakened and the weakening "energy" does not need to be maintained up to the moment of application of the energy pulse. It may even be added that provoking self-supported propagation at high temperature is not recommended in the case of heterostructures, as the stresses arising from coefficient of thermal expansion differences, that are released at the moment of fracture, could lead to breaking of the substrates.

It is worth stressing that, according to the invention, under certain conditions of implantation, the implanted area is weakened very strongly without generating purely thermal splitting, and this even for very high annealing temperatures (no splitting observed after 24 h of annealing at low temperature as defined below); on the other hand, self-supported splitting is initiated by simple addition of impulsional energy (such as a mechanical shock at the level of the weakened interface, for example).

The consequences of this are significant:

1) The operating window of the annealing step may be very wide: the maximum limit for the duration of this pre-weakening annealing is pushed back a long way (or even no longer exists); this is entirely favorable to the industrialization of the process.

2) There is no assisted splitting since the self-supported fracture enables the fracture wave to propagate instantaneously and without jerks over the whole of the area of the wafer; it is not necessary for any blade to penetrate between the substrate and the future thin film, which avoids damaging the layer transferred by the splitting tool. The self-supported fracture also clearly improves the topology of the surfaces exposed in this way (for example with lower roughness (especially at low frequency)), and avoids crown defects, which renders the whole of the thin film usable, including its periphery.

3) The fact that it is no longer necessary to introduce any tool is also favorable to the industrialization of the process and to collective treatment of the substrates by batches of wafers.

In that, at the latest at the time of the heat treatment, the source substrate is placed in intimate contact via said face with a stiffener or target substrate, the heat treatment contributes to improving the energy of bonding between these substrates.

This target substrate or stiffener is advantageously chosen from monocrystalline or polycrystalline materials, such as silicon or sapphire in particular, or in the form of an amorphous material, like for example in the form of fused silica.

According to one particularly advantageous feature of the invention, a plurality of species are implanted concomitantly or otherwise. This may advantageously be co-implantation of hydrogen and helium.

Advantageously, in the case of helium, in the case of hydrogen-helium co-implantation, hydrogen may be implanted (preferably in $H^+$ form) with a relatively low dose (typically of the order of a few $10^{16}$ $H/cm^2$), bearing in mind that hydrogen exhibits a high efficacy for creating a weakening layer. At the level of that layer, helium may be implanted at a relatively low dose (typically of the order of $10^{16}$ $He/cm^2$, or a few $10^{16}$ $He/cm^2$).

When the source substrate has been bonded to a target substrate, the low-temperature heat treatment (the temperature is nevertheless sufficient to obtain good solidity of the bonding interfaces) has the effect of allowing the splitting of an ultra-fine and very smooth film (roughness of the order of a few nm), initiated by an exterior pulse. The advantage of co-implantation is obtaining maximum weakening of this area at the temperature sufficient for the solidity of the bonding interfaces without this meaning having to reach excessive temperatures that heterostructures would not be able to withstand and without either being obliged to use very high implantation doses (which is a known means of limiting the value of the temperature necessary to develop the weakened area).

The two species are advantageously implanted at the same level but one variant consists in offsetting the implantation profiles. The two species may be implanted in any order, but it is advantageous, in the case of a silicon substrate and hydrogen-helium co-implantation, it is preferable to implant the deeper profile first.

In fact, at least when proceeding to a hydrogen-helium co-implantation in a silicon substrate, a heat treatment temperature from 200° C. to 400° C. may be chosen.

The source substrate is preferably of a material chosen from semiconductors and insulators, monocrystalline, polycrystalline or amorphous. Thus it may be chosen from the IV semiconductors; a particularly beneficial example is silicon but it may also be germanium or Si—Ge alloys. It may also be materials from the III-iV family or II-Vi materials such As—Ga or InP, or in insulative material such as ferro-electric materials, for example LiNbO3 and LiTaO3.

The heat treatment may also have a profile adapted to reduce the time of that treatment, as is for example disclosed in European patent application No. 02-293049 filed on Dec. 10, 2002.

In fact, the temperature range depends principally on the nature of the species implanted and on the nature of the material constituting the source substrate, and on the nature of the stiffening substrate, especially in the case of a heterostructure.

DETAILED DESCRIPTION

Figure 1:
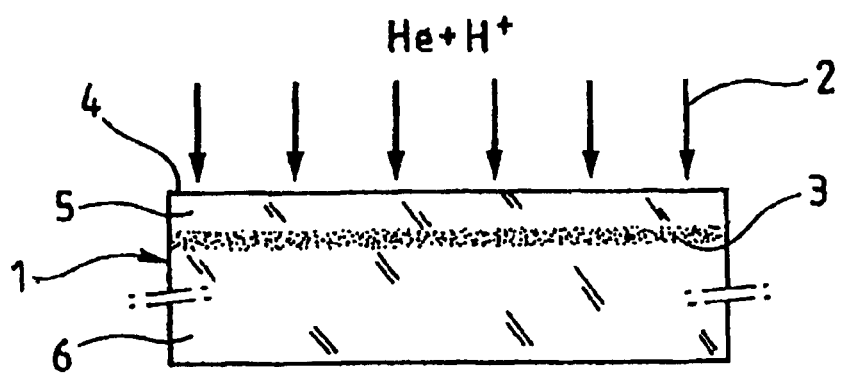
FIG. 1 is a diagram of a source substrate during implantation.

FIG. 1 shows a substrate 1, for example of silicon advantageously oxidized on its surface 4, while being subjected to an implantation treatment, represented by the arrows 2, for example by bombardment with ions or gaseous species.

This implantation involves, at a given depth, implantation of a first species which is adapted to generate defects, for example hydrogen, preferably in the form of $H^+$ ions. In a preferred embodiment of the invention, this implantation may be a co-implantation of two species, for example hydrogen-helium. In the case represented, the two species are implanted to the same depth, but alternatively it is preferable for the first species implanted to be that whose profile is deeper, for example the helium before the hydrogen.

Specifically a start is made by implanting the first species, for example, hydrogen, further to which the helium may be implanted. However, the inverse order of the implantations may be preferable, even if the two implantations are not made at the same depth.

A buried zone 3 results from this, weakened by the presence of defects.

The weakened zone 3 delimits, within the source substrate, a future thin film 5 and a substrate remainder 6, that is to say that which remains of the source substrate after splitting of the thin film; this remainder will be able to serve as source substrate for a new implementation cycle of the procedure.

Figure 2:
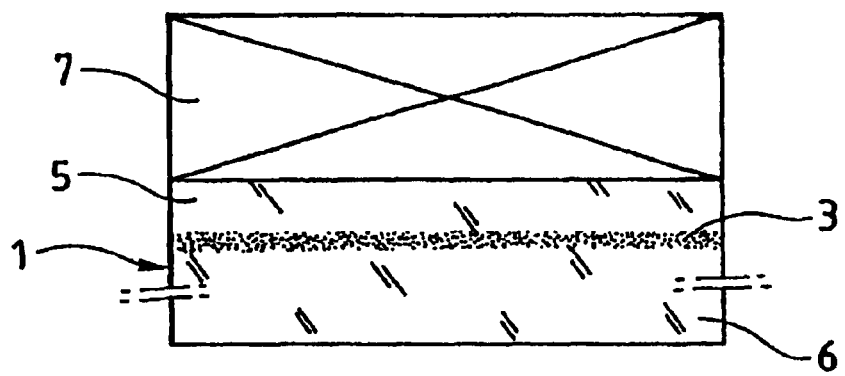
FIG. 2 is a later view of it after putting in intimate contact (bonding) with a target substrate.

FIG. 2 represents a step during the course of which the source substrate, containing the buried weakened zone 3, is placed by its face 4, into intimate contact with a corresponding face of a target substrate 7, typically by direct molecular bonding, whose function is that of a stiffener.

A heat treatment is then applied which will, on the one hand, enable development of the weakening of the buried layer 3, and on the other hand, when a bonding step has taken place, enable consolidation of the bonds between source substrate and target substrate.

More particularly, the temperature of this heat treatment is chosen from the range of temperatures suitable for developing the weakened zone.

This treatment is advantageously carried out at a temperature chosen from the range 200° C.-400° C., preferably from the range 300° C.-350° C., for a duration typically chosen of a few hours, for example 2 hours. Thus, the thermal budgets (temperature-duration pairs) are industrially realistic.

Figure 3:
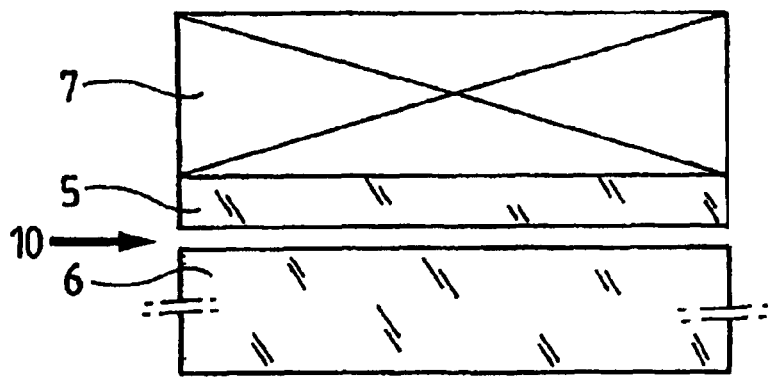
FIG. 3 is a view of it during splitting of a thin film deriving from the source substrate.

In FIG. 3 there is represented the step of splitting of the thin film 3 from the remainder of the source substrate, by means of the application of an impulsional provision of energy, preferably brief and of limited amplitude, for example in the form of a shock or pulse.

It is for example constituted by a mechanical stress represented by the arrow 10.

The splitting obtained is self-supported in the sense that, in particular, there is no movement of a tool along the weakened layer.

This local provision of energy is here limited to a part of the buried layer, represented in the form of a corner effect corresponding to a shock applied by a tool such as a blade on (or proximal to) a portion of that buried weakened layer; but it may be of any other nature, for example a couple parallel to the plane of the buried weakened layer advantageously applied in the form of a pulse of small angular amplitude. By virtue of the method of the invention, the face of the thin film which is freed by the self-supported splitting in the buried weakened zone (in practice substantially planar) has a roughness Ra considerably less than with the conventional solutions, without it having been necessary to provide a particular treatment of the surfaces transferred nor substantial ("coarse") polishing after splitting. It is worth noting that, since splitting is self-supported, there is no real propagation in fits and starts of a fracture wave liable to generate surface waves, and that, since there is no movement of any tool along newly created surfaces (or relative movement between the two parts on each side of the buried layer) there is no degradation of the surfaces thus freed, which therefore have a very smooth surface state, induced by the self-supported splitting.

The source substrate 1 may not only be of silicon, but more generally of any appropriate known material for example a IV, III-V or II-Vi semiconductor, ferroelectric, monocrystalline or polycrystalline or even amorphous. Thus the source substrate may be:

1) another semiconductor of column IV of the periodic table of the elements, for example of germanium, 2) a semiconductor of type III-V or II-VI such as AsGa or InP, in particular, or 3) an insulator, for example of niobate or tantalate type, such as $LiNbO_3$ or $LiTaO_3$, in particular.

The target substrate may be of a wide variety of materials, to be chosen according to needs, monocrystalline or polycrystalline (for example semiconductors, for example from among the same materials as for the source substrate) or even be amorphous (for example types of glass, or polymers); thus it may in particular be:

1) a crystalline material such as sapphire, 2) of fused silica or of another glass, or 3) a simple stiffening layer, for example of oxide a few microns thick, deposited by any appropriate known technique (this admittedly no longer corresponds to a bulk target substrate of the type represented in the drawings).

It is worth noting that the target substrate may be just an intermediate substrate from which the thin film is later transferred onto a final substrate.

EXAMPLES

Co-Implantation

According to a first embodiment of the invention, a substrate of Si (about 700 μm) comprising a layer of thermal $SiO_2$ on the surface (for example 145 nm) may be implanted initially with helium atoms under implantation conditions of 70 keV-$1 \times 10^{16}$ He/cm$^2$, and then be implanted with hydrogen atoms under implantation conditions of 30 keV-$4.25 \times 10^{16}$ H/cm$^2$. The deeper profile for the implantation is thus performed first. This source substrate may next be joined to a target substrate of Si (about 700 μm) by molecular bonding. A heat treatment around 350° C. for a certain time (for example 2 h) is then applied to the structure. If the heat treatment is suitable, for example as disclosed in the European patent application No. EP02-293049, the window for obtaining the self-supported fracture phenomenon is of the order of a few hours (for example, a weakening annealing from 2 to 6 hours). Then, with scarcely the commencement of insertion of a blade between the bonding interfaces in the form of a shock, self-supported splitting at the location of maximum hydrogen concentration leads to the transfer of the thin film of Si onto the target substrate. Thus these trials with co-implantation of hydrogen and helium in the source substrate under the conditions of the invention led to a self-supported splitting, for example, a complete and quasi-instantaneous splitting, with a continuous and plane propagation of the fracture wave, self-supported, initiated with the aid of an impulsional energy addition, which had in particular the advantage of avoiding surface undulations, in this case, of avoiding important variations of surface roughness after fracture, compared to progressive detachment. Because of this, this impulsional splitting implies thereafter less polishing.

The roughness of the surface transferred measured at high frequency (by atomic force microscopy), of the order of 45 to 50 angstroms RMS, and at low frequency (by profilometric method), of the order of 10 angstroms RMS, of that transferred surface are substantially less than those which may be obtained in the case of H-implanted alone (32 keV-$5.5 \times 10^{16}$ H/cm$^2$) followed by a heat treatment at 500° C. (roughness at high frequency of the order of 75 angstroms RMS and roughness at low frequency of the order of 26 angstroms RMS).

According to another embodiment of the invention, a substrate of Si (approximately 700 μm) comprising a layer of thermal $SiO_2$ on the surface (for example 200 nm) is implanted initially with helium atoms under implantation conditions of 70 keV-$2 \times 10^{16}$ He/cm$^2$, and then implanted with hydrogen atoms under the conditions of 30 keV-3×10$^{16}$ H/cm$^2$. The deepest profile is thus implanted first. This source substrate is then joined to a target substrate of fused silica (approximately 1000 µm) by direct bonding. A heat treatment around 300° C. is then applied to the structure for a certain time (3 h, for example, or more if the weakening treatment is adapted. Then, after bringing the structure back to ambient temperature, by means of a blade only scarcely inserted between the bonding interfaces and imparted with a movement pulse (for example a shock), self-supported splitting at the maximum of the hydrogen profile leads to the transfer of the Si thin film onto the fused silica substrate, without breakage or degradation of either of the substrates derived from the heterostructure after splitting (the fused silica substrate having the thin film of Si on the one hand, and the initial Si substrate having had the superficial thin film peeled from it on the other hand). The roughness of the surface transferred, measured at low frequency by profilometric method (of the order of 14 angstroms RMS at low frequency) and by atomic force microscopy (of the order of 75 angstroms at high frequency) of that transferred surface are substantially less than those which may be obtained in the case of H-implanted alone (32 keV-5.5×10$^{16}$ H/cm$^2$) annealed at 400° C. for 2 h using the progressive mechanical splitting method at ambient temperature (roughness at high frequency of the order of 90 angstroms RMS and roughness at low frequency of the order of 40 angstroms RMS).

Germanium on Insulator

The above information may be generalized to the situation of a source substrate of solid germanium, with the following weakening parameters: dose 7×10$^{16}$ H/cm$^2$ with an energy from 30 to 200 keV according to the thickness to be transferred, and annealing at 300° C. for a certain time (typically from 30 min to 1 h, in this case an operating window of 30 min).

After this heat treatment specific to these implantation conditions, the density of the microcracks present at the level of the implanted area is estimated to be from 0.03 to 0.035 per square micron, their sizes are of the order of 7 to 8 square microns, and the area opened up by these defects as a percentage of the total area of the wafer is from 25 to 32%. The characteristics of the weakened area may appear similar to characteristics observed when the fracture is obtained thermally, but different from those obtained after a weakening treatment of 280° C.-15 min, which implies an assisted mechanical fracture, in which case, these values are lower: for example, the area opened up by the microcracks represents less than 10% of the total area of the wafer.

Silicon on Insulator

In order to open the window of the process it may, for example, be preferred to implant a higher dose, for example at 30 keV-1.10$^{17}$ H/cm$^2$ and then to apply heat treatment at 350° C. for 30 min. It is possible in this way to obtain a 1 to 2 min window for the appearance of the self-supported fracture phenomenon, nevertheless without leading to thermal fracture.

AsGa on Insulator

The following conditions are applied:

1) implantation 5×10$^{16}$ at/cm$^2$; at 100 keV approx., 2) annealing at 250° C. for from 3 to 30 minutes.

The self-supported fracture phenomenon may be observed when the weakening annealing is conducted in a window from 3 to 30 minutes.

The invention claimed is:

1. A method of self-supported transfer of a thin film, the method comprising:
    preparing a source substrate;
    implanting at least a first species of ions or gas at a first dose in the source substrate at a specified depth with respect to a face of the source substrate, wherein the first species generates defects;
    applying a stiffener in intimate contact with the source substrate;
    applying a heat treatment to the source substrate, at a specified temperature for a specified time, so as to irreversibly create, substantially at the given depth, a buried weakened zone, without initiating a thermal splitting of the thin film,
    wherein the buried weakened zone includes crystalline defects comprising about 20% to 35% of a total surface area of the source surface; and
    applying a pulse of energy to only a portion of the buried weakened zone in the source substrate so as to provoke a self-supported splitting of the thin film delimited between the face of the source substrate and the buried weakened zone, with respect to a remainder of the source substrate in the absence of any additional splitting force.

2. The method according to claim 1, wherein the pulse of energy comprised a localized thermal provision.

3. The method according to claim 1, wherein applying a pulse of energy comprises applying the pulse in the form of a single brief movement of small amplitude by means of a tool.

4. The method according to claim 1, wherein applying the pulse of energy comprises shocking a peripheral zone of the buried weakened zone.

5. The method according to claim 1, wherein applying a pulse of energy comprises applying a pulse at a temperature of no more than about 300° C.

6. The method according to claim 5, wherein applying a pulse comprises applying the pulse at room temperature.

7. The method according to claim 1, wherein applying a heat treatment comprises conducting the heat treatment so that the density of the defects is from 0.03 to 0.035 per square micron.

8. The method according to claim 1, wherein applying a heat treatment comprises conducting the heat treatment so that the size of the defects is on the order of 7 to 8 square microns.

9. The method according to claim 1, wherein applying the stiffener comprises applying the stiffener at or before the moment of applying the heat treatment, and wherein the stiffener comprises a target substrate, the heat treatment contributing to improving the bonding energy between the source substrate and the target substrate.

10. The method according to claim 9, wherein the target substrate comprises an amorphous material.

11. The method according to claim 9, wherein the source substrate comprises silicon and the target substrate comprises fused silica.

12. The method according to claim 9, wherein the target substrate comprises a monocrystalline or polycrystalline material.

13. The method according to claim 10, wherein the target substrate comprises silicon.

14. The method according to claim 1, wherein the first species comprises hydrogen.

15. The method according to claim 14, wherein the first species comprises singly ionized hydrogen H$^+$.

16. The method according to claim 15, wherein implanting a first species comprises implanting at a dose on the order of at least about $10^{16}$ H/cm$^2$.

17. The method according to claim 1, further comprising implanting a second species, at a second dose, wherein the second species occupies the defects generated by the first species.

18. The method according to claim 17, wherein the first and second species are implanted at differing implant depths, and wherein the deeper implant is implanted first.

19. The method according to claim 17, wherein implanting a second species comprises implanting helium.

20. The method according to claim 19, wherein implanting the second species comprises implanting at a dose less than the first dose.

21. The method according to claim 1, wherein preparing a source substrate comprises preparing a substrate comprising one of semiconductors and insulators, monocrystalline, polycrystalline or amorphous materials.

22. The method according to claim 21, wherein the source substrate comprises a group IV semiconductor.

23. The method according to claim 22, wherein the source substrate comprises silicon.

24. The method according to claim 21, wherein the substrate comprises germanium.

25. The method according to claim 21, wherein the source substrate comprises GaAs.

26. The method according to claim 1, wherein applying the heat treatment comprises performing the heat treatment at a temperature of 200° C. to 400° C.

27. The method according to claim 1, wherein the heat treatment is performed at a temperature of 300° C. to 350° C.

28. The method according to claim 1, wherein the heat treatment is performed for approximately 2 hours to 5 hours.

29. The method according to claim 21, wherein the source substrate comprises a type III-V semiconductor material.

30. The method according to claim 29, wherein the source substrate comprises an insulator selected from the group consisting of LiNbO$_3$ and LiTaO$_3$.

31. A method of self-supported transfer of a thin film, the method comprising:
   preparing a source substrate;
   implanting helium and then implanting hydrogen in the source substrate, at a smaller depth than the helium implantation depth with respect to a face of the source substrate, wherein hydrogen generates defects
   applying a stiffener in intimate contact with the source substrate;
   applying a heat treatment to the source substrate, at a specified temperature for a specified time, so as to create, substantially at the given depth, a buried weakened zone, without initiating a thermal splitting of the thin film,
   wherein the buried weakened zone includes crystalline defects comprising about 20% to 35% of a total surface area of the source surface; and
   applying a pulse of energy to only a portion of the buried weakened zone in the source substrate so as to provoke a self-supported splitting of the thin film delimited between the face of the source substrate and the buried weakened zone, with respect to a remainder of the source substrate in the absence of any additional splitting force.

* * * * *